(12) United States Patent
Tomita

(10) Patent No.: US 9,047,946 B2
(45) Date of Patent: Jun. 2, 2015

(54) READ CIRCUIT AND NON-VOLATILE MEMORY USING THE READ CIRCUIT

(71) Applicant: Panasonic Corporation, Osaka (JP)

(72) Inventor: Yasuhiro Tomita, Osaka (JP)

(73) Assignee: Panasonic Intellectual Property Management Co., Ltd., Osaka (JP)

(\*) Notice: Subject to any disclaimer, the term of this patent is extended or adjusted under 35 U.S.C. 154(b) by 0 days.

(21) Appl. No.: 14/189,725

(22) Filed: Feb. 25, 2014

(65) Prior Publication Data

US 2014/0198557 A1    Jul. 17, 2014

Related U.S. Application Data

(63) Continuation of application No. PCT/JP2012/005199, filed on Aug. 20, 2012.

(30) Foreign Application Priority Data

Aug. 31, 2011  (JP) ................. 2011-188431

(51) Int. Cl.
| G11C 11/00 | (2006.01) |
|---|---|
| G11C 13/00 | (2006.01) |
| G11C 16/28 | (2006.01) |
| G11C 7/06 | (2006.01) |
| G11C 7/12 | (2006.01) |
| G11C 7/14 | (2006.01) |

(52) U.S. Cl.
CPC .......... *G11C 13/004* (2013.01); *G11C 13/0004* (2013.01); *G11C 13/0007* (2013.01); *G11C 13/0061* (2013.01); *G11C 2013/0042* (2013.01); *G11C 2013/0054* (2013.01); *G11C 16/28* (2013.01); *G11C 7/062* (2013.01); *G11C 7/12* (2013.01); *G11C 7/14* (2013.01)

(58) Field of Classification Search
USPC ................ 365/148, 163, 189.15, 211, 230.03
See application file for complete search history.

(56) References Cited

U.S. PATENT DOCUMENTS

| 5,422,854 A | 6/1995 | Hirano et al. |
|---|---|---|
| 6,456,524 B1 | 9/2002 | Perner et al. |

(Continued)

FOREIGN PATENT DOCUMENTS

| JP | 2003-151282 A | 5/2003 |
|---|---|---|
| JP | 2005-285161 A | 10/2005 |

(Continued)

OTHER PUBLICATIONS

International Search Report issued in International Application No. PCT/JP2012/005199 with Date of mailing Sep. 18, 2012, with English Translation.

*Primary Examiner* — Pho M Luu
(74) *Attorney, Agent, or Firm* — McDermott Will & Emery LLP

(57) ABSTRACT

A read circuit includes a current load circuit configured to supply a load current from a power source to a first input and a second input; a first discharge circuit configured to discharge potential of the first and second inputs to a ground level; an equalization circuit configured to equalize the potential of the first and second inputs; a differential circuit configured to receive the first and second inputs as differential inputs, and to output a first output and a second read output as differential outputs; and a second discharge circuit configured to discharge potential of the first and second read outputs to the ground level.

21 Claims, 17 Drawing Sheets

(56) References Cited

U.S. PATENT DOCUMENTS

| | | |
|---|---|---|
| 6,590,805 B2 | 7/2003 | Lu et al. |
| 7,495,984 B2 | 2/2009 | Kim et al. |
| 7,990,754 B2 * | 8/2011 | Azuma et al. .................. 365/148 |
| 8,406,035 B2 * | 3/2013 | Katoh et al. ................... 365/148 |
| 8,787,070 B2 * | 7/2014 | Shimakawa .................. 365/148 |
| 2002/0093032 A1 | 7/2002 | Hanzawa et al. |
| 2003/0117842 A1 | 6/2003 | Hanzawa et al. |
| 2003/0198081 A1 | 10/2003 | Tanizaki et al. |
| 2004/0080986 A1 | 4/2004 | Hanzawa et al. |
| 2004/0264244 A1 * | 12/2004 | Morimoto ..................... 365/180 |
| 2005/0105326 A1 | 5/2005 | Hanzawa et al. |
| 2006/0187720 A1 | 8/2006 | Hanzawa et al. |
| 2007/0165442 A1 * | 7/2007 | Hosoi et al. ................... 365/100 |
| 2008/0089137 A1 | 4/2008 | Hanzawa et al. |
| 2009/0238013 A1 | 9/2009 | Hanzawa et al. |
| 2009/0268538 A1 | 10/2009 | Fukushima |
| 2010/0315895 A1 | 12/2010 | Hanzawa et al. |
| 2011/0110142 A1 | 5/2011 | Kitagawa et al. |
| 2011/0116296 A1 | 5/2011 | Kitagawa et al. |

FOREIGN PATENT DOCUMENTS

| | | |
|---|---|---|
| JP | 4121830 B2 | 7/2008 |
| JP | 2009-266325 A | 11/2009 |

* cited by examiner

FIG.10A
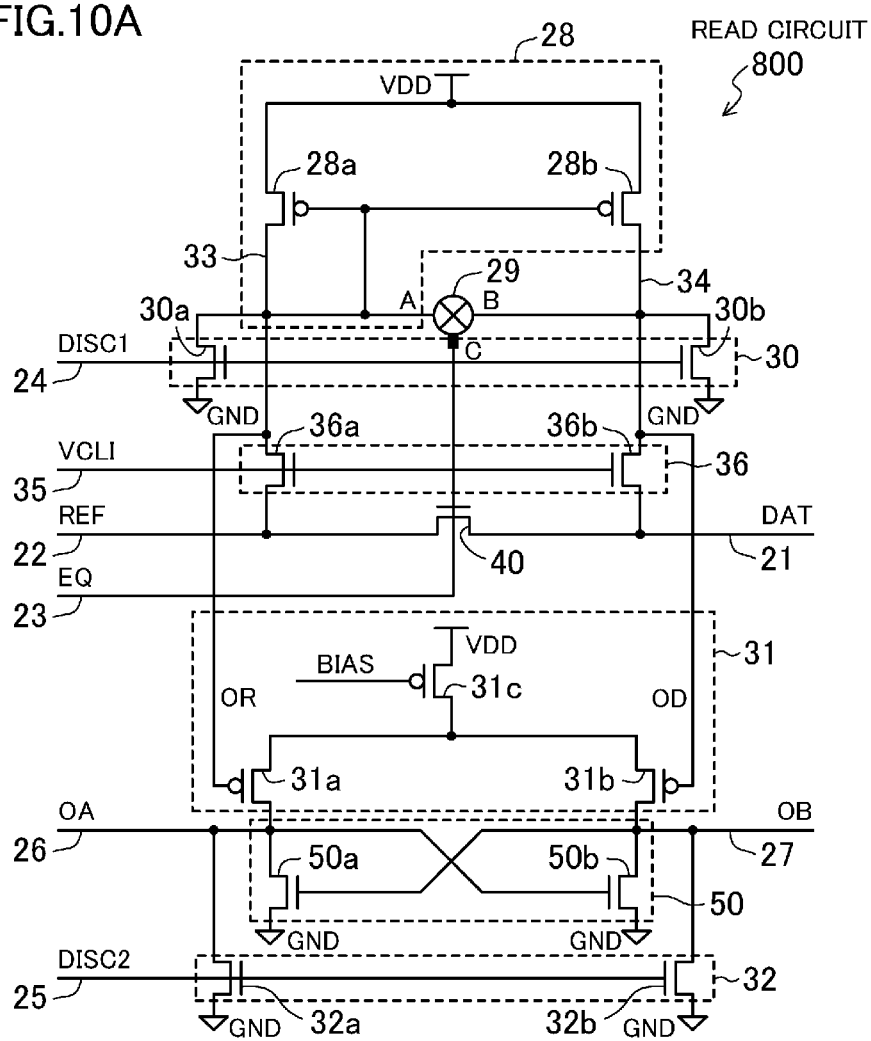
FIG.10B
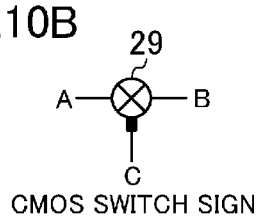
CMOS SWITCH SIGN
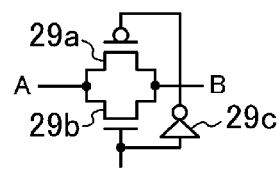
CMOS SWITCH EQUIVALENT CIRCUIT

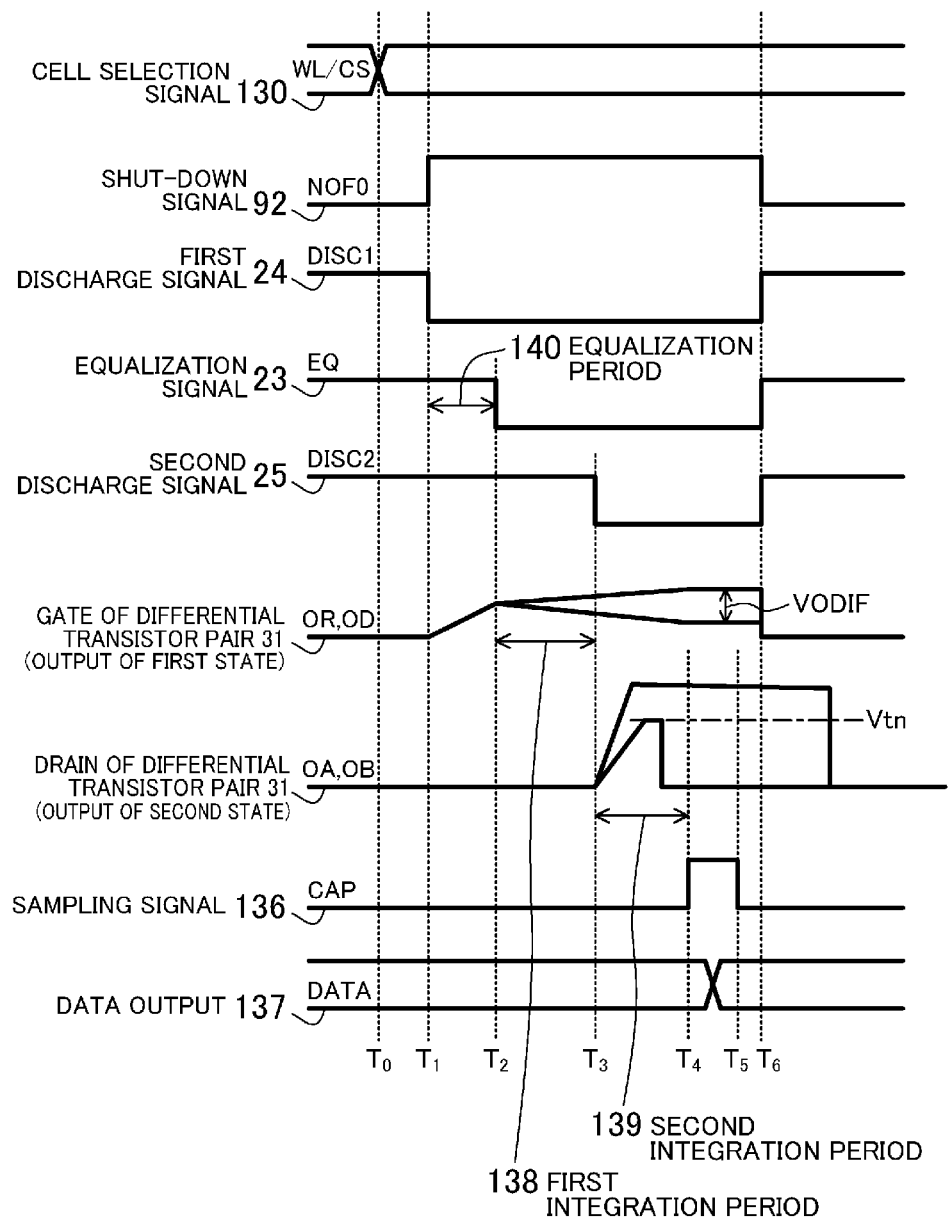

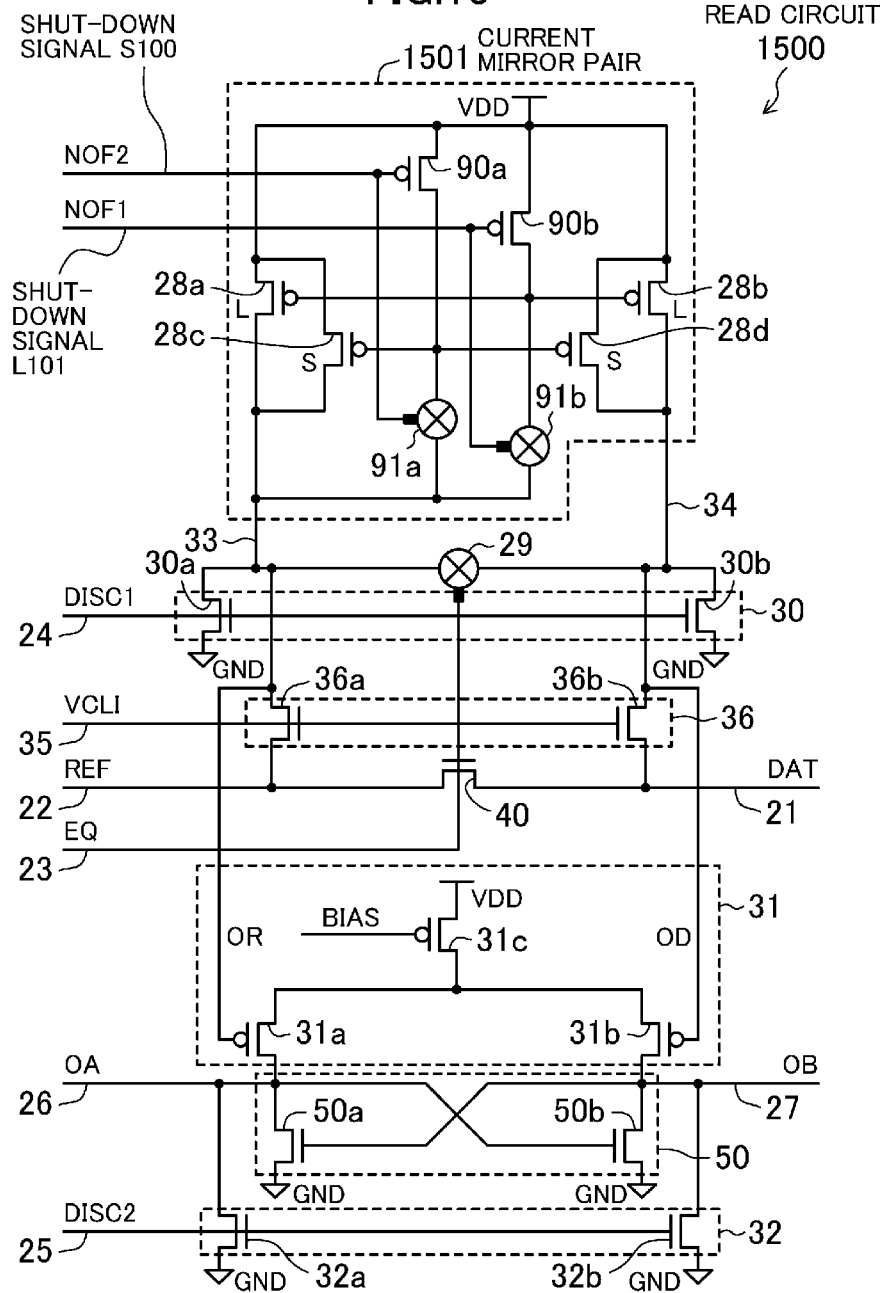

CURRENT MIRROR WITH TRANSISTORS IN EXCESSIVE SIZES

CURRENT MIRROR WITH TRANSISTORS IN SUITABLE SIZES

READ CIRCUIT AND NON-VOLATILE MEMORY USING THE READ CIRCUIT

CROSS-REFERENCE TO RELATED APPLICATIONS

This is a continuation of International Application No. PCT/JP2012/005199 filed on Aug. 20, 2012, which claims priority to Japanese Patent Application No. 2011-188431 filed on Aug. 31, 2011. The entire disclosures of these applications are incorporated by reference herein.

BACKGROUND

The present disclosure relates to non-volatile memories using variable resistance elements and read circuits of the memories, and more particularly to techniques providing low voltage operation at low power consumption.

Conventionally, NAND flash memories and NOR flash memories using floating-gate transistors or MONOS transistors are largely used as non-volatile memories. In recent years, as next-generation non-volatile memories following these memories, resistance variable non-volatile memories such as spin transfer torque magnetoresistive random access memories (STT_MRAMs), resistance RAMs (ReRAMs), and phase change RAMs (PRAMs) have drawn attention.

Data in resistance variable memories is rewritten by flowing rewrite currents to variable resistance elements to change the electrical resistance states of the variable resistance elements. A high resistance state is called HRS, while a low resistance state is called LRS. Variable resistance elements, to which currents flow in a single direction to change the resistance states, are called a monopolar type. Variable resistance elements, to which currents flow in both directions, i.e., which change the directions of current flow to change the resistance states, are called a bipolar type.

Data in resistance variable memories is read by flowing read currents to variable resistance elements to detect the resistance of the variable resistance elements. The number of read currents is set smaller than that of rewrite currents. As compared to flash memories, resistance variable memories perform rewriting at high speed and read operation at a low voltage. Therefore, in recent years, reading at a low voltage of 1 V or less with low power consumption utilizing this feature has been increasingly expected.

Read circuits determine digital values of data by comparing data written in variable resistance elements, i.e., the resistance states of the variable resistance elements, to the state of reference resistance, which may also be a current or a voltage. However, a serious problem of resistance variable memories is that the resistance states (i.e., the resistance values) vary depending on the number of rewriting, or that the resistance states vary temporally.

Read circuits need to accurately determine the digital values of memory cells, even when the resistance values of variable resistance elements vary within a wide range. That is, for example, even if sufficient margins are obtained between the resistance states of the variable resistance elements and a reference resistance, for example, immediately after rewriting data to the memory cells, or even when margins are hardly obtained, for example, when the read circuits are close to the end of lifetime. When the resistance of a variable resistance element is close to reference resistance, whether or not read circuits accurately and stably determine the resistance of the variable resistance element is important as a parameter for determining data holding characteristics of a non-volatile memory.

In response to the demand for the reduction in voltages, read circuits have the following problems. Read circuits convert resistance differences between memory cells and reference cells to currents or voltages, and amplify the currents or voltages with amplifiers to determine digital values. In read circuits, the resistance differences decrease with decreasing supplied voltages. Then, conversed values from the resistance differences to voltages etc., become small, and voltages supplied to transistors in the amplifiers become low. This reduces the gain of the amplifiers, and increases mismatch between pairs of transistors, thereby reducing the speed and the accuracy in reading. If the voltages further decrease, malfunctions of the read circuits increase, and at worst, the functions of the read circuits may stop.

A load circuit, which is a conventional current mirror circuit, and a differential amplifier using a differential transistor pair (i.e., a transconductance amplifier) are considered as a circuit which controls the lower limit operating voltage of a read circuit. In this circuit, the voltage needed for holding the current mirror circuit in a saturation state is obtained by the expression Vth+Vds_sat, where the threshold voltage of the transistors is Vth, and the drain voltage for holding the transistors in the saturation states is Vds_sat. In addition, since the voltage for holding the differential amplifier in the saturation state is obtained by the expression 2×Vds_sat, the minimum operating voltage Vdd_min of this circuit is expressed by the following equation.

$$Vdd\_min = Vth + 3 \times Vds\_sat$$

For example, in a process with Vth of 600 mV and Vds_sat of 200 mV, the minimum operating voltage Vdd_min is 1.2V. In order to set the minimum operating voltage Vdd_min to 1 V or lower, a process with much lower Vth and Vds_sat is needed.

SUMMARY

However, reduction in Vth may increase leakage currents, and reduction in Vds_sat may increase the mismatch between the transistor pair and degrade resolution of the amplifier. It is thus not preferable to lower Vth and Vds_sat too much. In addition, when the operating voltage becomes too low, the parasitic capacitance at a pn-junction, etc., causes the mismatch between bit lines, thereby largely influencing read operation. Therefore, the parasitic capacitance of the bit lines needs to decrease.

To address the problems, the present disclosure enables circuit operation at a low voltage close to the threshold voltage, and accurate data reading at high speed.

For example, a read circuit according to a first aspect of the present disclosure includes a current load circuit configured to supply a load current from a power source to a first input and a second input, which are coupled to a non-volatile memory array; a first discharge circuit configured to discharge potential of the first and second inputs to a ground level by control with a first discharge signal; an equalization circuit configured to short-circuit the first and second inputs by control with an equalization signal to equalize the potential of the first and second inputs; a differential circuit configured to receive the first and second inputs as differential inputs, and to output a first output and a second read output as differential outputs; and a second discharge circuit configured to discharge potential of the first and second read outputs to the ground level by control with a second discharge signal. The resistance between the potential of the first input and the ground is compared to the resistance between the potential of the second input and the ground, and the comparison result is read from the first read output and the second read output.

According to a second aspect of the present disclosure, in the first aspect of the present disclosure, before the read circuit performs read operation, the first discharge circuit fixes the first and second inputs to the ground level in accordance with the first discharge signal, the equalization circuit short-circuits the first and second inputs in accordance with the equalization signal, and the second discharge circuit fixes the first and second read outputs to the ground level in accordance with the second discharge signal. When the read circuit performs the read operation, the first discharge circuit releases fixation of the first and second inputs to the ground level in accordance with the first discharge signal, after release by the first discharge circuit, the equalization circuit releases short-circuit of the first and second inputs in accordance with the equalization signal, and after release by the equalization circuit, the second discharge circuit releases fixation of the first and second read outputs to the ground level in accordance with the second discharge signal. The resistance between the first input and the ground is compared to the resistance between the second input and the ground, and the comparison result is read from the first read output and the second read output.

A read circuit according to a third aspect of the present disclosure reads data of a variable resistance memory cell in comparison with a reference cell. The read circuit includes a memory cell input coupled to the variable resistance memory cell; a reference input coupled to the reference cell; a current mirror pair being a pair of p-channel transistors, each having a source coupled to a power source, one of the p-channel transistors having a drain coupled to gates of the pair of p-channel transistors being a mirror current input drain coupled to the reference input, and the other of the p-channel transistors having a drain being a mirror current output drain coupled to the memory cell input; a first equalization transistor having a gate receiving an equalization signal, and a drain and a source, which are coupled between the drains of the pair of p-channel transistors of the current mirror pair; a first discharge transistor pair being a pair of n-channel transistors, each having a gate receiving a first discharge signal, and a source coupled to ground, one of the n-channel transistors having a drain coupled to the drain of the first equalization transistor, and the other of the n-channel transistors having a drain coupled to the source of the first equalization transistor; a differential transistor pair being a pair of p-channel transistors, each having a source coupled to the power source, and a drain outputting a first read output or a second read output, which is a differential output, one of the p-channel transistors having a gate coupled to the drain of the first equalization transistor, and the other of the p-channel transistors having a gate coupled to the source of the first equalization transistor; and a second discharge transistor pair being a pair of n-channel transistors, each having a gate receiving a second discharge signal, and a drain coupled to one of the drains of the p-channel transistors of the differential transistor pair, and a source coupled to the ground.

According to a fourth aspect of the present disclosure, the read circuit of the third aspect of the present disclosure further includes a clamp transistor pair being a pair of n-channel transistors, each having a gate receiving a clamp voltage input as an input signal. The mirror current input drain is coupled to the reference input via a drain and a source of one of the n-channel transistors of the clamp transistor pair. The mirror current output drain is coupled to the memory cell input via a drain and a source of the other of the n-channel transistors of the clamp transistor pair. The output potential of the reference input and the memory cell input are set to the level obtained by subtracting the threshold voltage of the clamp transistor pair from the voltage applied to the clamp voltage input.

According to a fifth aspect of the present disclosure, in the read circuit of the fourth aspect of the present disclosure, a voltage is applied to the clamp voltage input such that output voltages of the memory cell input and the reference input are equal to or lower than 500 mV. This configuration controls the voltage applied to the elements of a ReRAM or an MRAM, thereby increasing the reliability.

According to a sixth aspect of the present disclosure, the read circuit of the fourth aspect of the present disclosure further includes a second equalization transistor including an n-channel transistor having a gate receiving an equalization signal, and a drain and a source, which are coupled between the reference input and the memory cell input. The output potential of the reference input and the memory cell input are accurately set to the same potential even in low voltage operation.

According to a seventh aspect of the present disclosure, in the read circuit of the sixth aspect of the present disclosure, the gate of the one of the p-channel transistors of the differential transistor pair is coupled not to the drain of the first equalization transistor but to the drain of the second equalization transistor. The gate of the other of the p-channel transistors is coupled not to the source of the first equalization transistor but to the source of the second equalization transistor. This configuration reduces the common mode voltage of the potential of the gates of the differential transistor pair, thereby enabling lower voltage operation.

According to an eighth aspect of the present disclosure, in the read circuit of the third aspect of the present disclosure, the first equalization transistor is a CMOS switch formed by coupling a p-channel transistor and an n-channel transistor in parallel. This enables low voltage operation.

According to a ninth aspect of the present disclosure, the read circuit of the third aspect of the present disclosure further includes a cross-coupled transistor pair including a first n-channel transistor and a second n-channel transistor, each having a drain coupled to the first read output or the second read output, and a source coupled to the ground, the first n-channel transistor having a gate coupled to the drain of the second n-channel transistor, and the second n-channel transistor having a gate coupled to the drain of the first n-channel transistor. This configuration stabilizes the first read output and the second read output, thereby facilitating read operation in the next block (i.e., at the next stage).

According to a tenth aspect of the present disclosure, in the read circuit of the third aspect of the present disclosure, the mirror current input drain is coupled not to the reference input but to the memory cell input. The mirror current output drain is coupled not to the memory cell input but to the reference input. This configuration improves the amplification degree of the read circuit.

According to an eleventh aspect of the present disclosure, the read circuit of the third aspect of the present disclosure further includes a pull-up transistor including a p-channel transistor having a gate receiving a shutdown signal, and a drain and a source, which are coupled between the gates of the p-channel transistors of the current mirror pair and the power source; and a gate bias transistor including a CMOS switch coupled between the gates of the p-channel transistors of the current mirror pair and the mirror current input drain, formed by coupling a p-channel transistor and an n-channel transistor in parallel, and receiving the shutdown signal. When any one of the p-channel transistor of the pull-up transistor or the CMOS switch of the gate bias transistor is in a conduction state, the shutdown signal complementarily brings the other to a non-conduction state. When the n-channel transistors of the first discharge transistor pair are in the conduction state, the shutdown signal brings the p-channel transistor of the pull-up transistor to the conduction state, and the CMOS switch of the gate bias transistor to the non-conduction state to inactivate the current mirror pair. When the n-channel transistors of the first discharge transistor pair are in the non-conduction state, the shutdown signal brings the p-channel transistor of the pull-up transistor to the non-conduction state, and the CMOS switch of the gate bias transistor to the conduction state to activate the current mirror pair. This configuration reduces the current consumption in discharging and not in discharging.

According to a twelfth aspect of the present disclosure, the read circuit of the third aspect of the present disclosure further includes the current mirror pair configured to receive a plurality of shutdown signals; the current mirror pair including a plurality of p-channel transistor pairs; a plurality of pull-up transistors each corresponding to one of the plurality of p-channel transistor pairs, and having a gate receiving one of the plurality of shutdown signals, and a drain and a source, which are coupled between gates of the corresponding one of the p-channel transistor pairs and the power source; and a plurality of gate bias transistors each having a CMOS switch corresponding to one of the plurality of p-channel transistor pairs, being paired with one of the plurality of pull-up transistors, coupled between gates of the corresponding one of the p-channel transistor pairs and the mirror current input drain, being formed by coupling a p-channel transistor and an n-channel transistor in parallel, and receiving one of the shutdown signals corresponding to the paired one of the plurality of pull-up transistors. When the n-channel transistors of the first discharge transistor pair are in a conduction state, each of the plurality of shutdown signals brings the p-channel transistor of corresponding one of the plurality of pull-up transistors to the conduction state, and the CMOS switch of corresponding one of the plurality of gate bias transistors to a non-conduction state to inactivate the current mirror pair. When the n-channel transistors of the first discharge transistor pair are in the non-conduction state, at least one of the plurality of shutdown signals brings the p-channel transistor of corresponding one of the plurality of pull-up transistors to the non-conduction state, and the CMOS switch of paired one of the plurality of gate bias transistors to the conduction state to activate the current mirror pair. This configuration reduces the current consumption in discharge. In addition, in a non-discharge state, the drive capability of the transistors of the current mirror pair is variable and can be set to most preferable drive capability according to the power source voltage, thereby increasing the operating speed.

According to a thirteenth aspect of the present disclosure, in the read circuit of the third aspect of the present disclosure, before the read circuit performs read operation, the first discharge transistor pair fixes the mirror current input drain and the mirror current output drain to a ground level in accordance with the first discharge signal, the first equalization transistor short-circuits the mirror current input drain and the mirror current output drain in accordance with the equalization signal, and the second discharge transistor pair fixes potential of the drains of the p-channel transistors of the differential transistor pair to the ground level in accordance with the second discharge signal. When the read circuit operates the read operation, the first discharge transistor pair releases fixation of the mirror current input drain and the mirror current output drain to the ground level by transition of the first discharge signal, the first equalization transistor releases short-circuit of the mirror current input drain and the mirror current output drain by transition of the equalization signal after a desired equalization period has passed after release by the first discharge transistor pair, and the second discharge transistor pair releases fixation of the drains of the p-channel transistors of the differential transistor pair to the ground level by transition of the second discharge signal after a desired first integration period has passed after release by the first equalization transistor, and the read circuit determines an output logic level based on levels of the drains of the p-channel transistors of the differential transistor pair after a desired second integration period has passed after release by the second discharge transistor pair. This configuration efficiently biases the gate voltages of the transistors and compensates the capacitance offset between the bit line inputs and the input offset between the differential transistor pair, thereby performing operation within a wide power source range, particularly lowest voltage operation with low power consumption.

A non-volatile memory according to a fourteenth aspect of the present disclosure includes one of the read circuits according to the first and the third aspects of the present disclosure, a non-volatile memory array including the variable resistance memory cell; a read column gate configured to select a bit line or a source line to select the variable resistance memory cell from the non-volatile memory array when the read circuit performs read operation of the variable resistance memory cell included in the non-volatile memory array; a rewrite circuit configured to perform rewrite operation of the variable resistance memory cell included in the non-volatile memory array; and a rewrite column gate configured to select the bit line or the source line to select the variable resistance memory cell from the non-volatile memory array when the rewrite circuit performs the rewrite operation of the variable resistance memory cell included in the non-volatile memory array. This configuration reduces the parasitic capacitance at the bit line and the source line in the reading operation, thereby enabling high speed operation at a low voltage with low power consumption, as compared to the case where a column gate is used in common for rewriting and reading.

According to a fifteenth aspect of the present disclosure, in the non-volatile memory of the fourteenth aspect of the present disclosure, the read column gate is a switch of an n-channel transistor, and the rewrite column gate is a CMOS switch formed by coupling a p-channel transistor and an n-channel transistor in parallel. This configuration applies a less reduced rewrite voltage in write operation using larger current than read operation, thereby enabling stable rewrite operation. This configuration also reduces the parasitic capacitance at the bit line and the source line in the reading operation, thereby enabling high speed operation at a low voltage with low power consumption, as compared to the case where a column gate is used in common between the read circuit and the rewrite circuit.

According to a sixteenth aspect of the present disclosure, in the non-volatile memory of the fourteenth aspect of the present disclosure, the read circuit, the read column gate coupled to the read circuit, the rewrite circuit, and the rewrite column gate coupled to the rewrite circuit are located at one ends of the bit line and the source line. This configuration easily increases the capacity of the memory array. The control circuits are gathered in one place, thereby reducing the circuit area.

According to a seventeenth aspect of the present disclosure, in the non-volatile memory of the fourteenth aspect of the present disclosure, the read circuit and the read column gate coupled to the read circuit are located at one ends of the bit line and the source line, and the rewrite circuit and the rewrite column gate coupled to the rewrite circuit are located at the other ends of the bit line and the source line. This reduces wiring congestions around the column gates to facilitate layout designing, and provides the circuit using a small number of wiring layers.

BRIEF DESCRIPTION OF THE DRAWINGS

FIGS. 10A-10B are circuit diagrams of a read circuit according to an eighth embodiment.

FIG. 12 is a waveform chart illustrating operation of the read circuit according to the ninth embodiment.

FIG. 13 is a circuit diagram of a read circuit according to a tenth embodiment.

DETAILED DESCRIPTION

Figure 1:
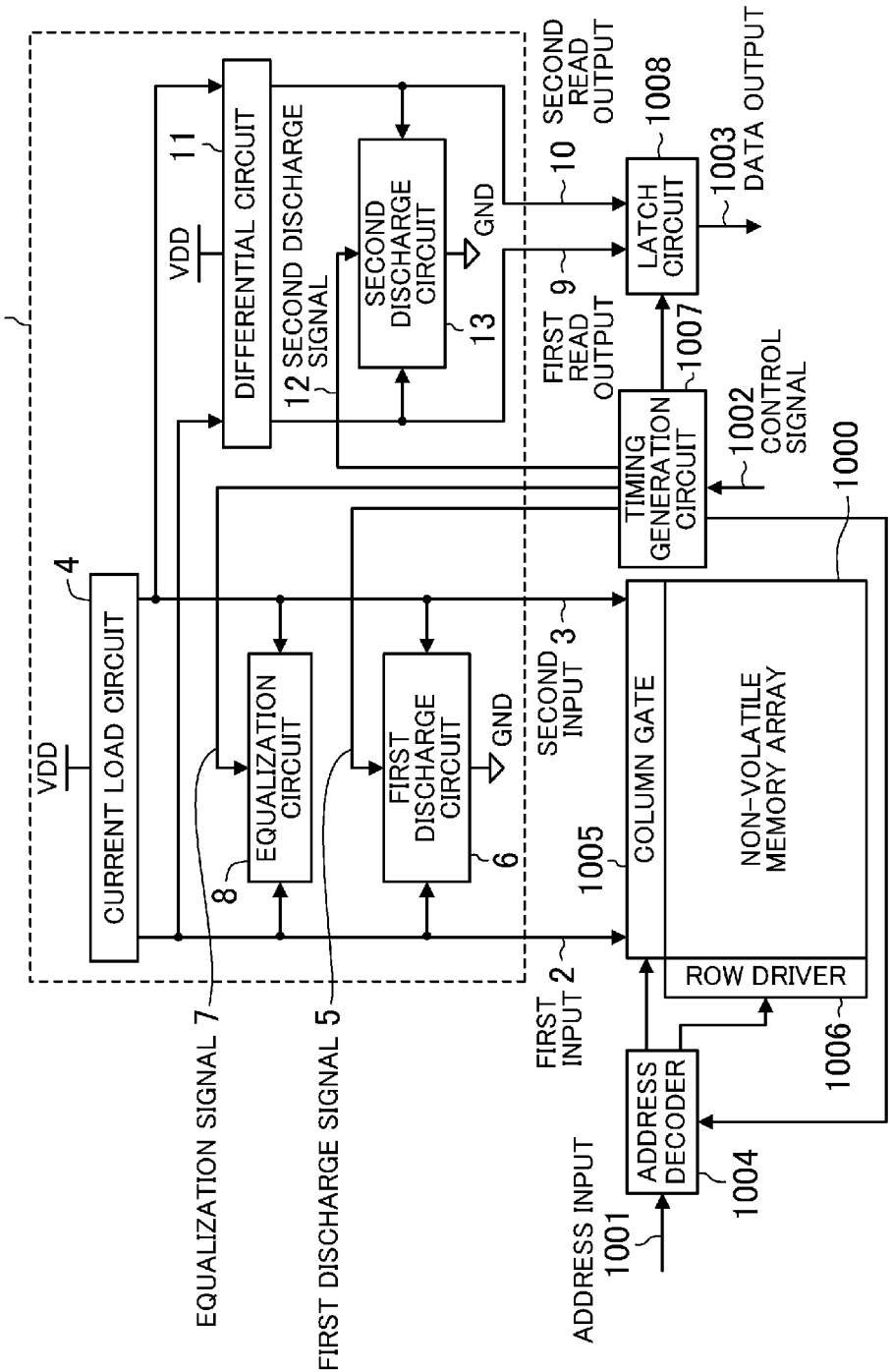
FIG. 1 is a block diagram of a non-volatile memory including a read circuit according to a first embodiment.

Embodiments of the present disclosure will be described below. In the embodiments, the same reference characters are used to represent equivalent elements and signals.

First Embodiment

First, a read circuit according to a first embodiment will be described.

FIG. 1 is a block diagram of a non-volatile memory including the read circuit according to the first embodiment of the present disclosure. A first input 2 and a second input 3 of a read circuit 1 are coupled to non-volatile memory array 1000 via a column gate 1005. Each of the first input 2 and the second input 3 is coupled to a non-volatile memory cell (also simply referred to as a memory cell), a reference cell, etc., included in the non-volatile memory array 1000.

This embodiment assumes that reference cells are non-volatile memory cells similar to memory cells, or memory cells including polysilicon resistors or transistors in place of variable resistance elements. The reference cells are not limited thereto, as long as they serve as comparison references. The read circuit 1 outputs differential outputs between a first read output 9 and a second read output 10.

The non-volatile memory cells forming the non-volatile memory array 1000 are variable resistance elements with two terminals, for example, ReRAMs, STT-MRAMs, PRAMs, etc. This embodiment assumes that the memory cells are of a 1T1R type formed by adding an access transistor to each memory element. In a 1T1R memory cell, a variable resistance element is inserted to the drain or the source of an access transistor. This embodiment assumes that each variable resistance element is inserted to the drain of an access transistor.

The variable resistance elements of the memory cells arranged along bit lines are coupled to the bit lines extending in parallel to the variable resistance elements, and the sources of the access transistors are coupled to source lines extending in parallel to the bit lines. Word lines are arranged orthogonal to the source lines and the bit lines. The gates of the access transistors of the memory cells parallel to the word lines are coupled to the word lines. A certain memory cell is selected by a row driver 1006 selecting one of the word lines and a column gate 1005 selecting one of the bit lines. Every time when a memory cell is accessed, there is no need to select one of the source lines coupled to the memory cell. During reading, all source lines may be set to ground potential.

The read circuit 1 includes a current load circuit 4, a first discharge circuit 6, an equalization circuit 8, a differential circuit 11, and a second discharge circuit 13. The current load circuit 4 may be a current mirror circuit, etc., supplying a load current from a power source VDD. The output of the current load circuit 4 is output to the column gate 1005 as the first input 2 and the second input 3, and applied to the first discharge circuit 6 discharging the first input 2 and the second input 3 to a ground (GND) level. The output of the current load circuit 4 is also output to the equalization circuit 8 short-circuiting the first input 2 and the second input 3. Furthermore, the first input 2 and the second input 3 are applied, as differential inputs, to the differential circuit 11 having reference potential of the power source VDD. The first read output 9 and the second read output 10, which are differential outputs of the differential circuit 11, are applied to the second discharge circuit 13 discharging the first read output 9 and the second read output 10 to the ground (GND) level.

A control signal 1002 input to the non-volatile memory activates a timing generation circuit 1007, thereby executing read operation. An address input 1001 input to the non-volatile memory is decoded by an address decoder 1004, thereby driving the column gate 1005 and the row driver 1006. Then, the bit line of a desired memory cell according to the address input 1001, and the bit line of the reference cell are coupled to the first input 2 or the second input 3.

The timing generation circuit 1007 generates as signals needed at timing of read operation of the read circuit 1, an equalization signal 7, a first discharge signal 5, a second discharge signal 12, etc. The timing generation circuit 1007 controls a latch circuit 1008 latching the first read output 9 and the second read output 10 of the read circuit 1. Data read from the non-volatile memory is output as a data output 1003.

Next, timing of read operation will be described.

The read circuit 1 initializes the first input 2 and the second input 3 to be short-circuited at the ground level as the initialized state before the read operation. In this state, the differential inputs of the differential circuit 11 are at the ground level. For example, a maximum drain current of a differential transistor, which is a p-channel transistor, can be supplied, thereby enabling high-speed operation. At this time, a maximum current flows through the differential circuit 11. It is therefore clear that a current path of the differential circuit 11 at the source is preferably shut until read operation starts, to reduce power consumption.

Read operation is executed in the following steps.

First, in step 1, before the read operation, the timing generation circuit 1007 initializes at least the first discharge signal 5 and the equalization signal 7 to initial values. Specifically, the first discharge signal 5 is initialized in the first discharge circuit such that the first input 2 and the second input 3 are at the ground level. The equalization signal 7 is initialized in the equalization circuit 8 such that the first input 2 and the second input 3 are short-circuited.

Next, in step 2, at start of reading, the timing generation circuit 1007 drives the first discharge signal 5. This releases the fixation of the first input 2 and the second input 3 to the ground level. In the equalization circuit 8, since the first input 2 and the second input 3 are short-circuited and a current is supplied from the current load circuit 4 so that the potential of the first input 2 and the second input 3 rises while keeping the equal potential. At this time, the parasitic capacitance of the first input 2 and the second input 3 are charged to equal potential, thereby reducing the mismatch between input voltages caused by a difference in input capacitance in a subsequent step.

Then, in step 3, after a desired equalization period has passed, the timing generation circuit 1007 drives the equalization signal 7. This releases the fixation of the first input 2 and the second input 3 to the short-circuit state made by the equalization circuit 8. A potential difference occurs between the potential of the first input 2 and the second input 3 in accordance with a difference between the resistance of the memory cell and the resistance of the reference cell.

After the step 3, in step 4, after a desired first integration period has passed, the timing generation circuit 1007 drives the second discharge signal 12. This releases the first read output 9 and the second read output 10 from the ground level set by the second discharge circuit 13. The potential of the first read output 9 and the second read output 10 fixed to the ground level rises while being differentiated by charging to the parasitic capacitance and IR drop using resistance.

The first read output 9 and the second read output 10 are fixed to the ground level in the step 3 and earlier. While the outputs are fixed to the ground level, the current path of the differential circuit 11 is preferably shut to reduce power consumption.

The first integration period is set when a sufficient voltage difference occurs between the first input 2 and the second input 3 to prevent malfunction of the differential circuit 11 due to an offset voltage of the input to the differential circuit 11 and a noise voltage in a non-common mode.

After the step 4, in step 5, after a desired second integration period has passed, when a sufficient voltage difference occurs between the first read output 9 and the second read output 10, the timing generation circuit 1007 drives the latch circuit 1008 to latch (i.e., hold) data. The latch circuit 1008 may have a cross-coupling structure of an RS flip-flop, an inverter, etc.

As described above, in this embodiment, the first amplification stage using the current load circuit 4 is coupled to the second amplification stage using the differential circuit 11 to set the first input 2 and the second input 3 around the ground level, thereby reducing the voltage in the operation points of the amplification stages. That is, the read circuit 1 according to this embodiment has a configuration preferred to low-voltage operation.

Second Embodiment

Next, a read circuit according to a second embodiment will be described using a transistor-level equivalent circuit.

Figure 2:
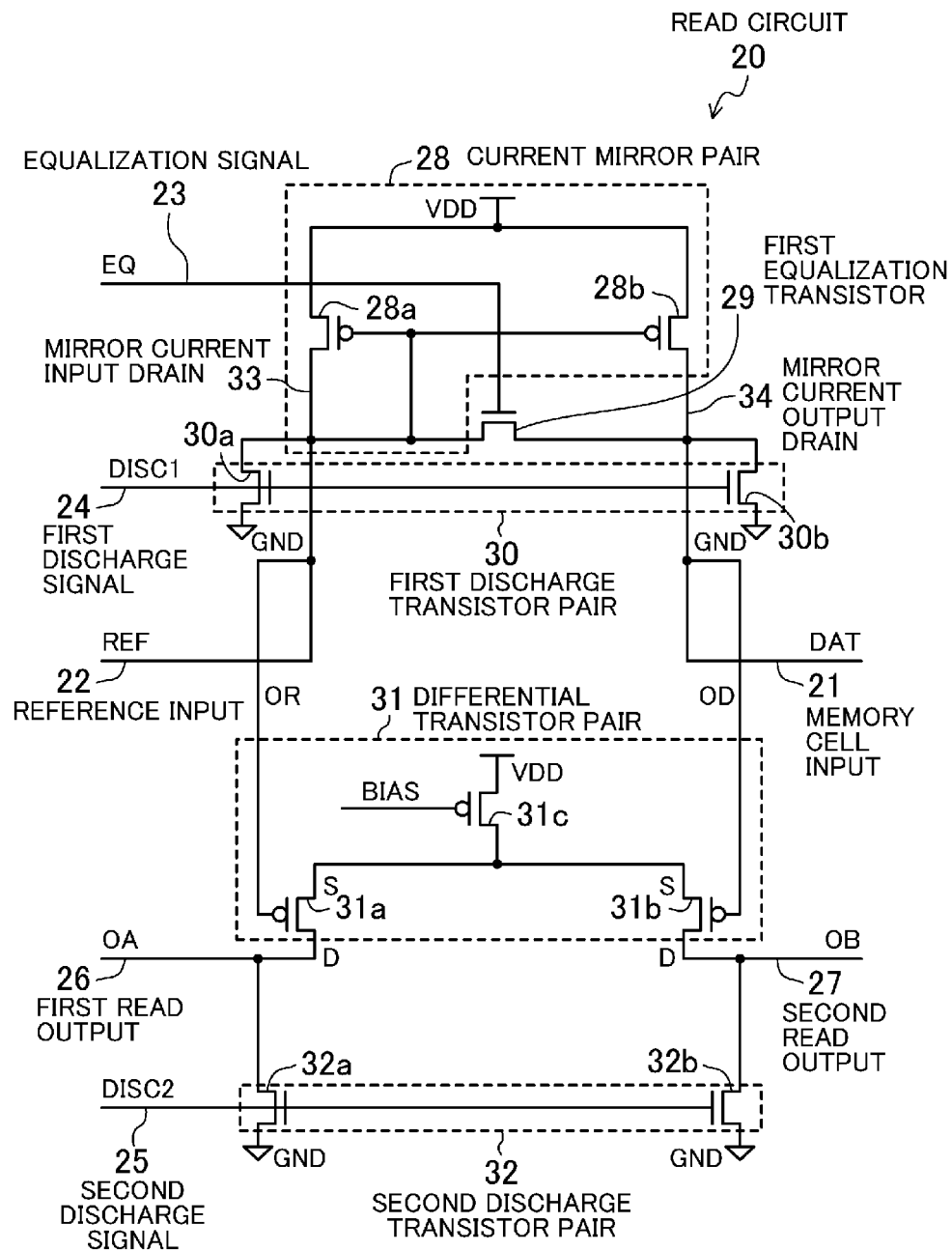
FIG. 2 is a circuit diagram of a read circuit according to a second embodiment.

FIG. 2 is a circuit diagram of the read circuit according to the second embodiment, and specifically illustrates the configuration of the first embodiment using transistors.

A read circuit 20 includes a current mirror pair 28 of p-channel transistors 28a and 28b, a first equalization transistor 29, a first discharge transistor pair 30 of n-channel transistors 30a and 30b, a differential transistor pair 31 of p-channel transistors 31a and 31b, and a second discharge transistor pair 32 of n-channel transistors 32a and 32b.

A mirror current input drain 33 of the current mirror pair 28 is coupled to a reference input 22 (REF). A mirror current output drain 34 is coupled to a memory cell input 21 (DAT). The current mirror pair 28 forms a first amplification stage, and the differential transistor pair 31 forms a second amplification stage. In the current mirror pair 28, the drain of the p-channel transistor 28a is coupled to the gates of the p-channel transistors 28a and 28b to form the mirror current input drain 33. The drain of the p-channel transistor 28b forms the mirror current output drain 34. The drain of the p-channel transistor 28b may be coupled to the gates of the p-channel transistors 28a and 28b to form the mirror current input drain 33, and the drain of the p-channel transistor 28a may form the mirror current output drain 34.

The first equalization transistor 29 is an n-channel transistor, which receives an equalization signal 23 (EQ) at the gate. The drain and the source of the first equalization transistor 29 are coupled between the drains of the p-channel transistors 28a and 28b.

A first discharge signal 24 (DISC1) is input in common to the gates of the n-channel transistors 30a and 30b of the first discharge transistor pair 30. The drain of the n-channel transistor 30a is coupled to the drain of the first equalization transistor 29. The drain of the n-channel transistor 30b is coupled to the source of the first equalization transistor 29. The sources of the n-channel transistors 30a and 30b are coupled to ground.

A p-channel load transistor 31c is, as a common current source, coupled to the sources of the p-channel transistors 31a and 31b of the differential transistor pair 31. The p-channel load transistor 31c is biased by a voltage BIAS. Differential inputs OR and OD of the differential transistor pair 31 are input to the gates of the p-channel transistors 31a and 31b. The first equalization transistor 29 receives the differential input OR at the drain, and the differential input OD at the source. The differential transistor pair 31 outputs a first read output 26 (OA) and a second read output 27 (OB) as differential outputs. When the second discharge transistor pair 32 is in a conduction state, and the p-channel load transistor 31c is biased to an off-state to reduce a through-current. This reduces the power consumption.

A second discharge signal 25 (DISC2) is input in common to the gates of the n-channel transistors 32a and 32b of the second discharge transistor pair 32. The drain of the n-channel transistor 32a is coupled to the first read output 26. The drain of the n-channel transistor 32b is coupled to the second read output 27. The sources of the n-channel transistors 32a and 32b are coupled to ground.

Figure 3:
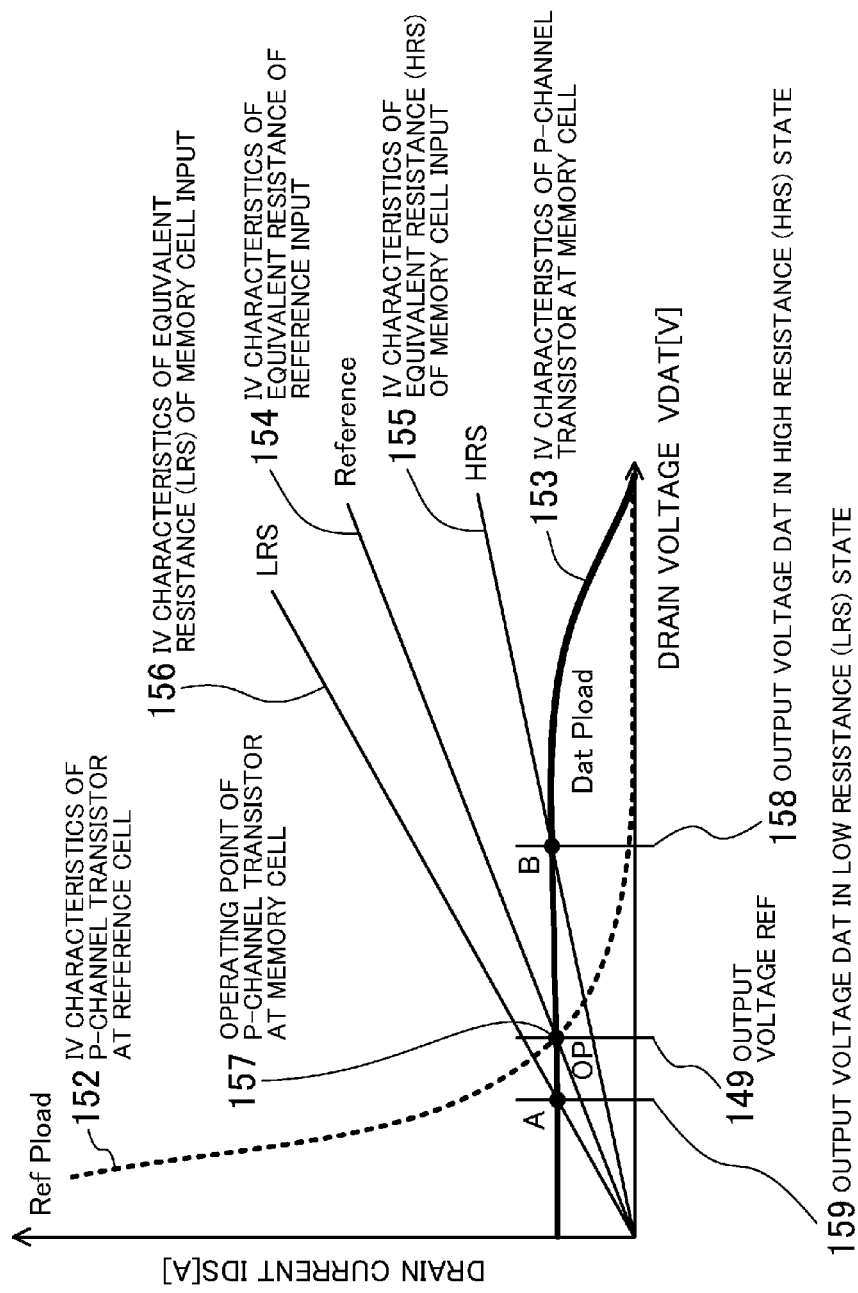
FIG. 3 illustrates operation of a current mirror pair according to the second embodiment.

The timing of the read operation in this embodiment is similar to that in the first embodiment. Operation of the current mirror pair 28 at a low voltage will be described herein with reference to FIG. 3. FIG. 3 illustrates the operation of the current mirror pair. In FIG. 3, the vertical axis represents a drain current IDS of the current mirror pair 28, and the horizontal axis represents a drain voltage VDAT. The drain voltage VDAT corresponds to the output voltages of the memory cell input 21 and the reference input 22 of FIG. 2.

When the operation of the current mirror pair 28 is approximated by direct-current operation at a low voltage, the input current of the current mirror pair 28 is equal to the drain current at an intersection OP between IV characteristics 152 of the diode-coupled p-channel transistor 28a at the reference cell and IV characteristics 154 of equivalent resistance of the reference input 22. The intersection OP represents an operating point of the p-channel transistor 28b at the memory cell. The drain voltage at the intersection OP is an output voltage REF 149, and is also the gate voltage of the p-channel transistor 28b at the memory cell. The line of IV characteristics 153 of the p-channel transistor 28b at the memory cell, which passes through the intersection OP, corresponds to the characteristics of the current load circuit of the memory cell.

If data is read from a memory cell, the output voltage of the current mirror pair 28 is determined by the intersection between the IV characteristics 153 of the p-channel transistor 28b at the memory cell and IV characteristics (155 and 156) of equivalent resistance of the memory cell input 21 based on the resistance of a variable resistance element. For example, when the variable resistance element is in a low-resistance (LRS) state, an intersection A between the IV characteristics 153 and the IV characteristics 156 of equivalent resistance (LRS) of the memory cell input 21 is an output voltage DAT 159 in a low resistance state (LRS). On the other hand, when the variable resistance element is in the high resistance state (HRS), an intersection B between the IV characteristics 153 and the IV characteristics 155 of equivalent resistance (HRS) of the memory cell input 21 is an output voltage DAT 158 in a high resistance state (HRS). When the intersections A and B are included in the saturation region of the IV characteristics 153 of the p-channel transistor 28b at the memory cell, a differential voltage occurs from the output voltage REF 149 as shown in FIG. 3.

The minimum operating voltage Vdd_min of the current mirror pair 28 is expressed by the following equation.

$$Vdd\_min = Vtp + Vds\_sat + Vc \quad (1)$$

where the threshold voltage of each p-channel transistor of the current mirror pair 28 is Vtp, the saturation drain voltage needed for operating the current mirror pair 28 as a mirror circuit is Vds_sat, and the bias voltage needed for a memory cell is Vc.

For example, in a conventional 0.18 micron generation process, Vtp can be set to about 0.6 V, and Vds_sat can be set to about 0.15 V. Therefore, where Vc is set to 0.1 V, Vdd_min of about 0.85 V is obtained from the equation (1).

As described above, in this embodiment, the first amplification stage using the current load circuit is coupled to the second amplification stage using the differential circuit, and the inputs to these amplification stages are set around the ground level. As a result, the operating points of the amplification stages are set to low voltages. That is, the read circuit 20 according to this embodiment has a configuration preferred to low voltage operation.

Third Embodiment

Figure 4:
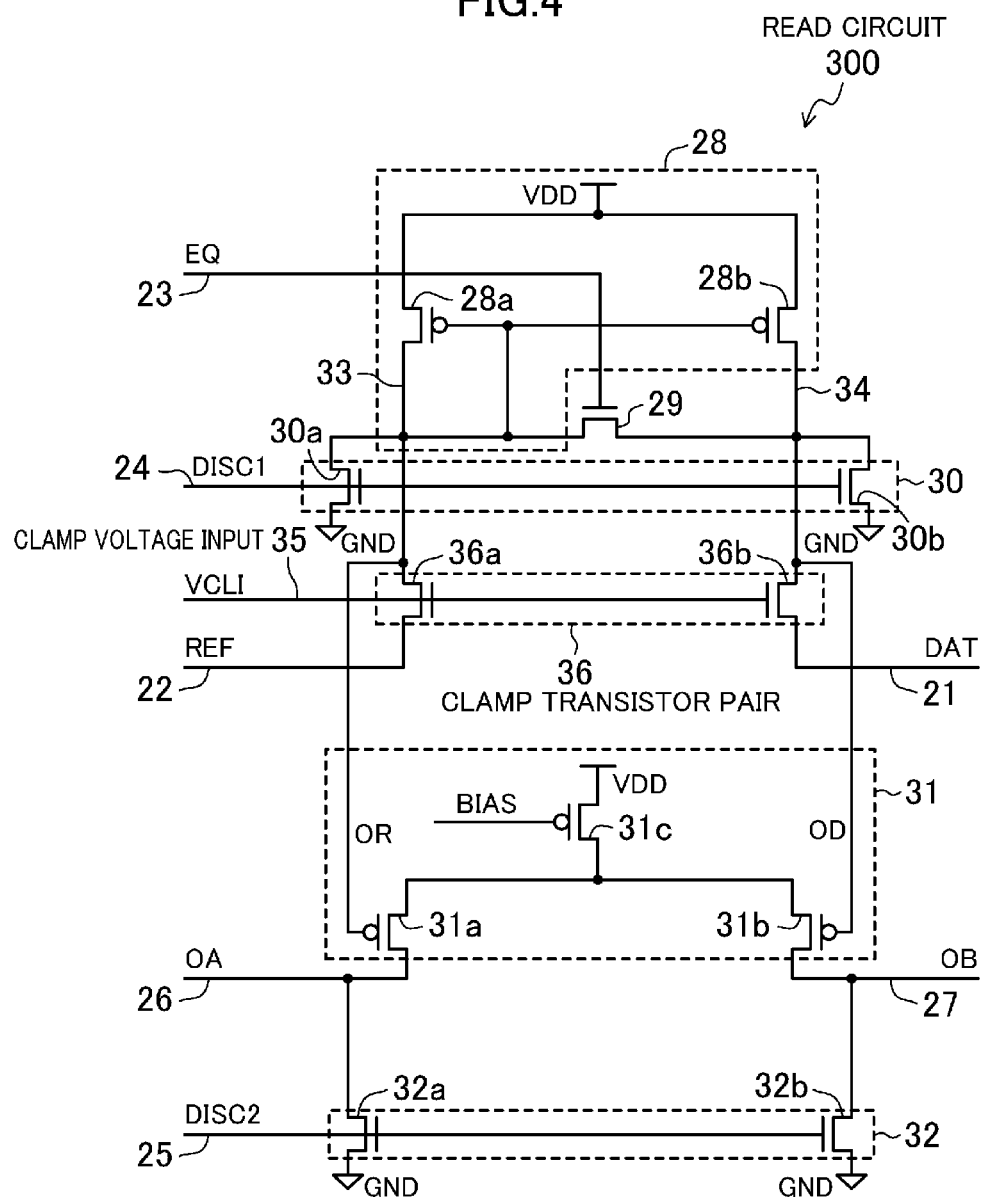
FIG. 4 is a circuit diagram of a read circuit according to a third embodiment.

As a third embodiment, a read circuit described below includes a clamp transistor pair in addition to the configuration of the second embodiment. FIG. 4 is a circuit diagram of the read circuit according to the third embodiment, and the diagram of an equivalent circuit of the read circuit shown in the first embodiment.

A read circuit 300 includes a clamp transistor pair 36 of n-channel transistors 36a and 36b. Each of the clamp transistor pair 36 is inserted to the reference input 22 or the memory cell input 21. Specifically, the mirror current input drain 33 is coupled to the reference input 22 via the drain and the source of the n-channel transistor 36a. The mirror current output drain 34 is coupled to the memory cell input 21 via the drain and the source of the n-channel transistor 36b. The gates of the n-channel transistors 36a and 36b are coupled in common to the clamp voltage input 35. The clamp transistor pair 36 controls the voltages of the reference input 22 and the memory cell input 21 to be equal to or lower than a clamp voltage VCLO, which is controlled by the voltage VCLI of the clamp voltage input 35. The clamp voltage VCLO can be approximated by the equation VCLO=VCLI−Vtn, where the threshold voltage of the clamp transistor pair 36 is Vtn.

As specific values, where VCLO of 0.3V is needed for maintaining the reliability of the memory cells in a process with the threshold voltage Vtn of 0.6V, VCLI of 0.9V is required. While VCLI is usually applied as a constant voltage generated by a reference power source, the power source voltage may be directly applied when the read circuit 300 operates at a low voltage. This reduces current consumption of the reference voltage source. As specific values, under the above-described conditions for reliability, the equation VCLI=VDD is obtained, where VCLI is equal to or lower than the higher one of a power source voltage VDD of 0.9V, or a power source voltage VDD when the potential of the drain of the clamp transistor pair 36 is 0.3 V or lower.

The timing of read operation according to this embodiment is similar to that of the first embodiment.

As described above, in this embodiment, the clamp transistor pair 36 is inserted to the input and the output of the current mirror pair 28 in the first amplification stage. This controls the voltages applied to the memory cells to be equal to or lower than a desired voltage, and reduces high-voltage application to the variable resistance element occurring at reading, i.e., weak writing.

The amplification of the voltages applied to the bit lines are equal to or lower than the clamp voltage VCLI, thereby reducing the power consumption. In low-voltage operation, the power source voltage is directly applied to the clamp voltage input 35, thereby reducing the power consumption.

The clamp voltage VCLI is preferably applied to the clamp voltage input 35 such that the output voltages of the memory cell input 21 and the reference input 22 are equal to or lower than 500 mV.

Fourth Embodiment

Figure 5:
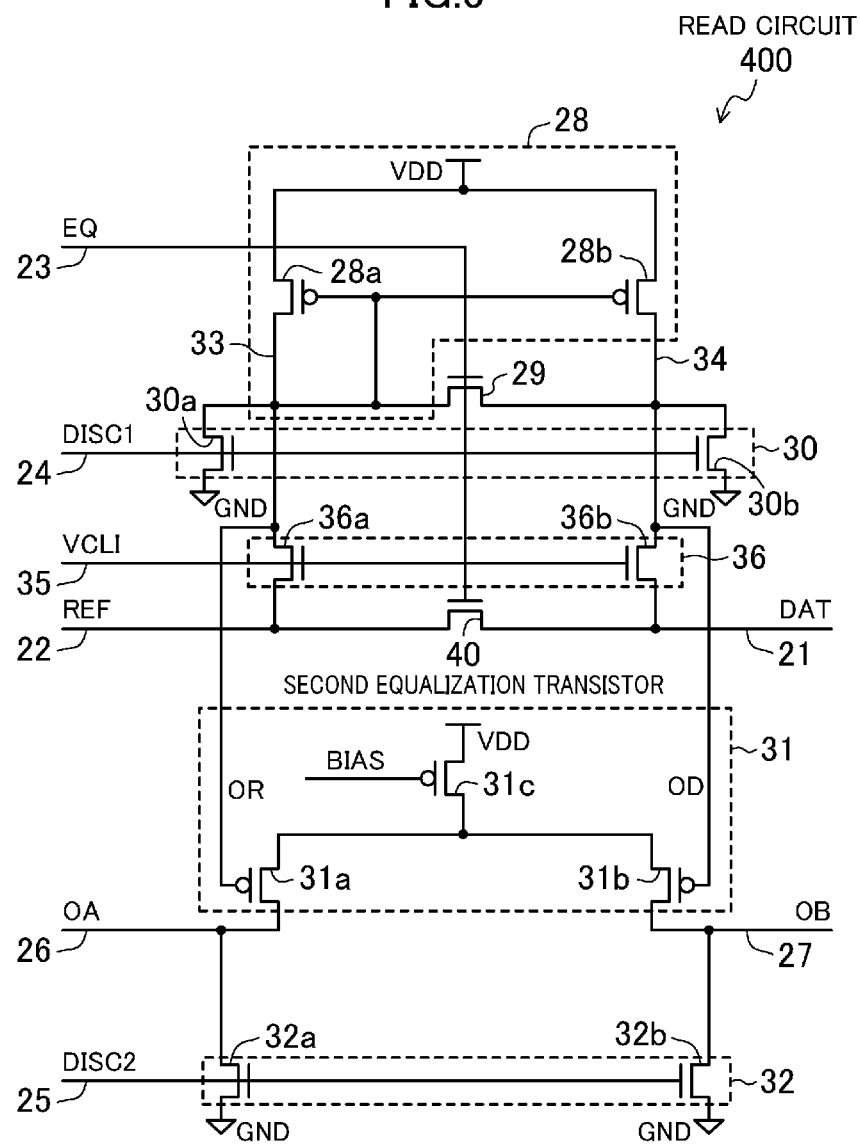
FIG. 5 is a circuit diagram of a read circuit according to a fourth embodiment.

As a fourth embodiment, a read circuit described below includes a second equalization transistor in addition to the configuration of the third embodiment. FIG. 5 is a circuit diagram of the read circuit according to the fourth embodiment, and the diagram of an equivalent circuit of the read circuit shown in the first embodiment.

A read circuit 400 includes a second equalization transistor 40, which is an n-channel transistor, between a reference input 22 and a memory cell input 21. An equalization signal 23 is input to the gate of the second equalization transistor 40. As such, the first and second equalization transistors 29 and 40 are provided at the input and output of the clamp transistor pair 36, thereby increasing the speed of charging and discharging of the parasitic capacitance between the bit lines coupled to the reference input 22 and the memory cell input 21. This improves equalization accuracy. The timing of read operation according to this embodiment is similar to that of the first embodiment.

Fifth Embodiment

Figure 6:
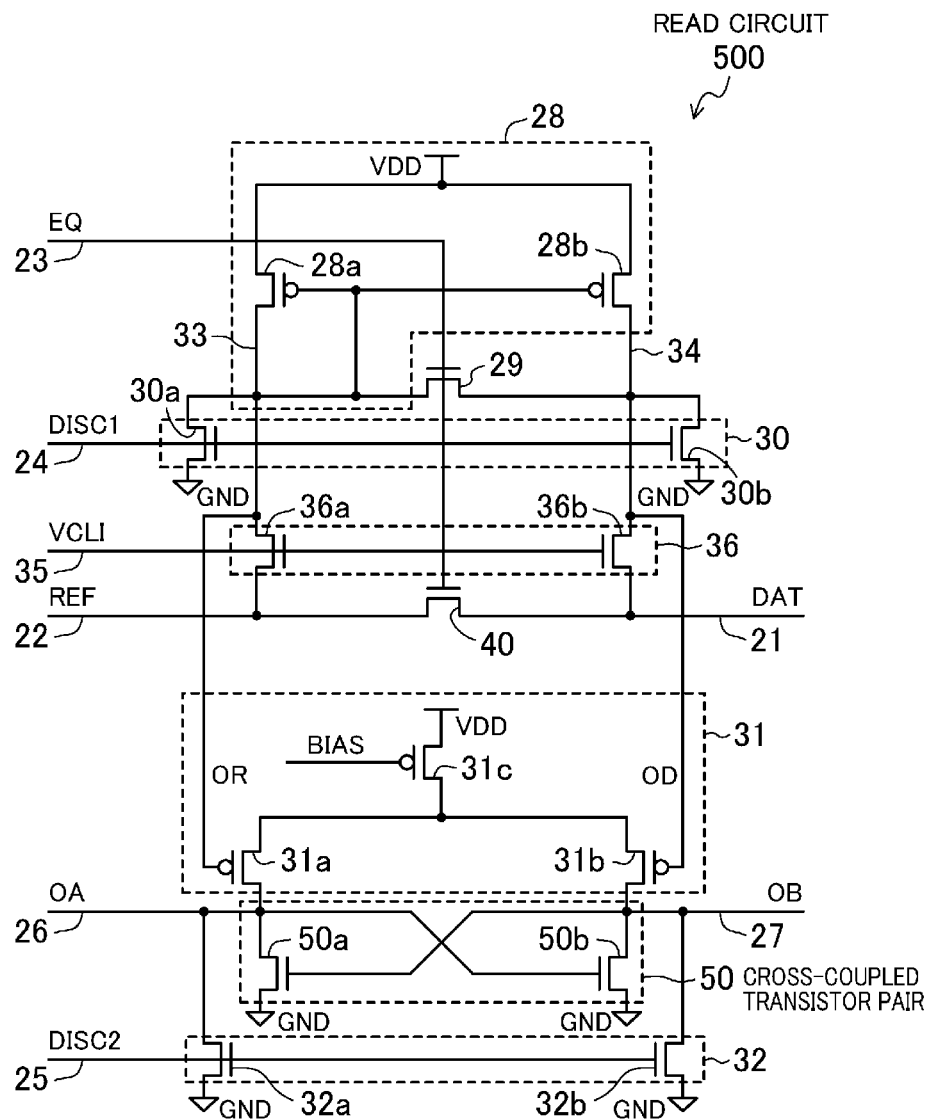
FIG. 6 is a circuit diagram of a read circuit according to a fifth embodiment.

As a fifth embodiment, a read circuit described below includes a cross-coupled transistor pair in addition to the configuration of the fourth embodiment. FIG. 6 is a circuit diagram of the read circuit according to the fifth embodiment, and the diagram of an equivalent circuit of the read circuit shown in the first embodiment.

A cross-coupled transistor pair 50 includes two n-channel transistors 50a and 50b. The drain of the n-channel transistor 50a is coupled to a first read output 26. The drain of the n-channel transistor 50b is coupled to a second read output 27. The sources of the n-channel transistors 50a and 50b are coupled to ground. The gate of the n-channel transistor 50a is coupled to the drain of the n-channel transistor 50b. The gate of the n-channel transistor 50b is coupled to the drain of the n-channel transistor 50a.

The timing of read operation according to this embodiment is similar to that of the first embodiment.

The operation of the cross-coupled transistor pair 50 will be described below. During the second integration period shown in the first embodiment, if the potential of the first read output 26 and the second read output 27 is equal to or lower than the threshold voltage of the n-channel transistors 50a and 50b, the cross-coupled transistor pair 50 is cut off and does not function. If one of the potential of the first read output 26 or the second read output 27 exceeds the threshold voltage, the n-channel transistor having the gate connected to the read output with potential exceeding the threshold voltage is in a conduction state, while the read output with potential not exceeding the threshold voltage is pulled down to the ground. Then, the low level output, which was in a floating state, is driven by a transistor, thereby improving noise resistance.

As described above, in this embodiment, the one of the first and second read outputs 26 and 27, which is at the high level, is held at the VDD by the differential transistor pair 31. The other one at the low level is held at the ground by the cross-coupled transistor pair 50. This improves noise resistance. In addition, the amplitude of the voltage of the read output becomes stable, thereby reliably sending signals to the next stage. Since the cross-coupled transistor pair 50 is automatically activated in accordance with a change in the read outputs, the second integration period can be easily set.

Sixth Embodiment

Figure 7:
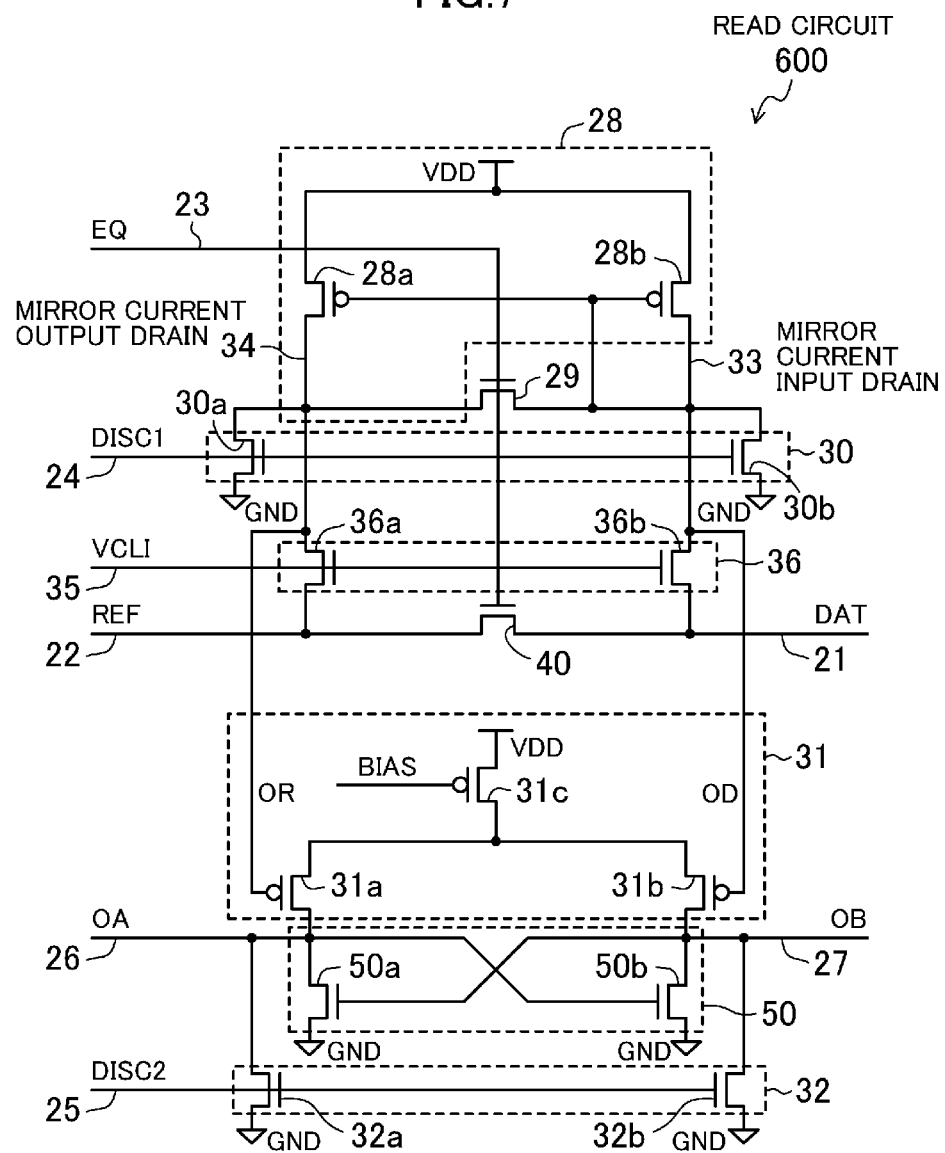
FIG. 7 is a circuit diagram of a read circuit according to a sixth embodiment.

As a sixth embodiment, a read circuit described below has the configuration of the fifth embodiment, but the input and the output of the current mirror pair 28 are inverted. FIG. 7 is a circuit diagram of the read circuit according to the sixth embodiment, and the diagram of an equivalent circuit of the read circuit shown in the first embodiment. The timing of read operation according to this embodiment is similar to that of the first embodiment. In this embodiment, the configuration of the first amplification stage including the current mirror pair 28 will be described.

In the current mirror pair 28 of a read circuit 600, a mirror current input drain 33 is coupled to a memory cell input 21, and a mirror current output drain 34 is coupled to a reference input 22. The drain of a p-channel transistor 28a forms the mirror current output drain 34. The drain and the gate of a p-channel transistor 28b are coupled together to form a diode-coupled structure. The drain of the p-channel transistor 28b forms the mirror current input drain 33. This determines the bias current of the current mirror. In the above-described embodiments, the mirror current input drain 33 is at the reference cell, and thus a constant bias current is supplied regardless of the resistance of the variable resistance element of each memory cell. On the other hand, in this embodiment, the mirror current input drain 33 is coupled to the memory cell, and thus the bias current of the current mirror varies in accordance with the resistance of the variable resistance element of each memory cell.

Figure 8:
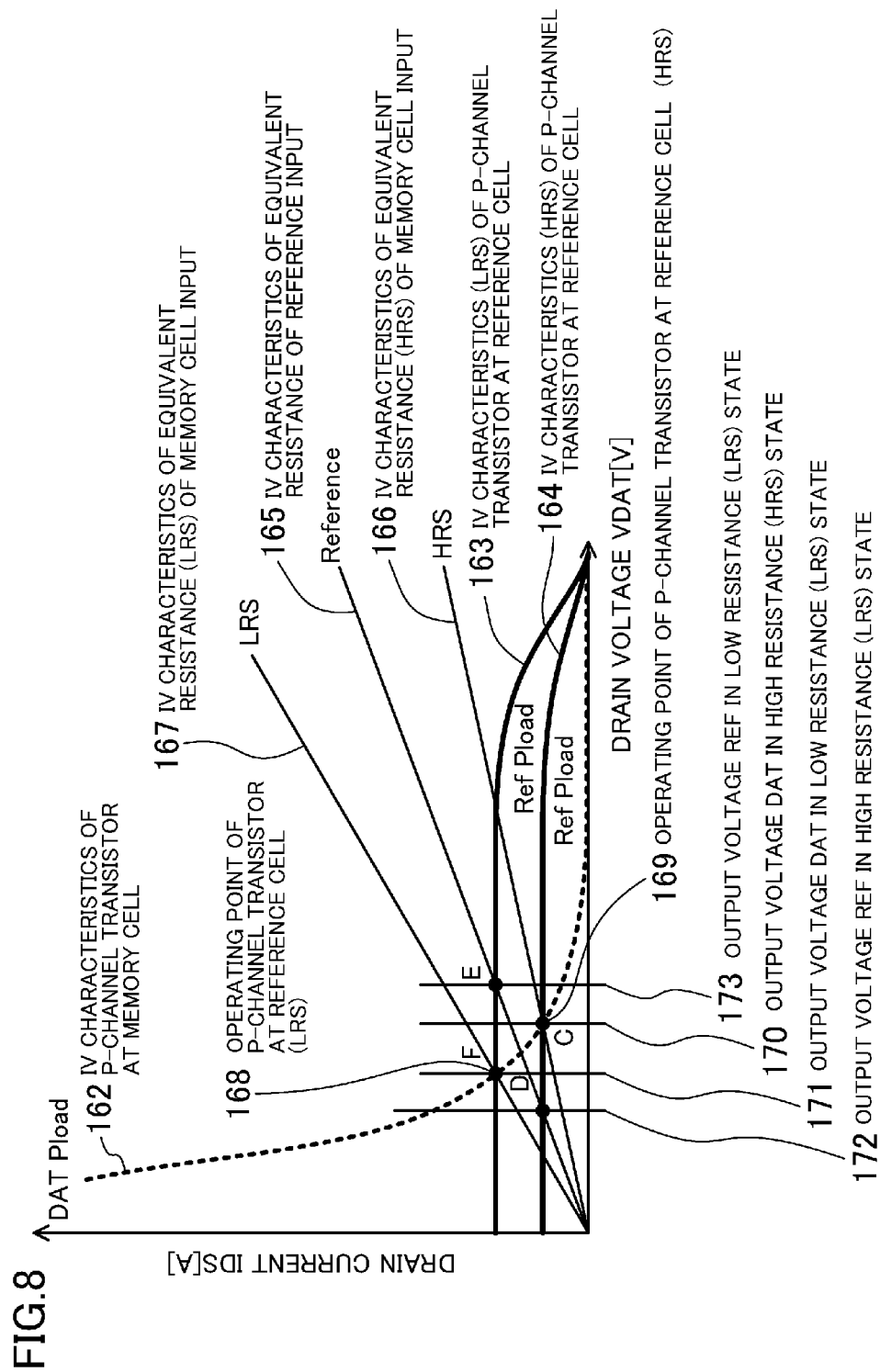
FIG. 8 illustrates operation of a current mirror pair according to the sixth embodiment.

The operation of the current mirror pair 28 at a low voltage will be described with reference to FIG. 8. FIG. 8 illustrates the operation of the current mirror pair shown in FIG. 7. In FIG. 8, the vertical axis represents a drain current IDS of the current mirror pair, and the horizontal axis represents a drain voltage VDAT. The drain voltage VDAT corresponds to the output voltages of the memory cell input 21 and the reference input 22 of FIG. 7.

When the operation of the current mirror pair 28 is approximated by direct-current operation at a low voltage, the input current of the current mirror pair 28 is equal to the drain current at the intersection between the IV characteristics 162 of the p-channel transistor 28b at the memory cell, and the IV characteristics (166 and 167) of equivalent resistance of the memory cell input 21. The intersection is determined in accordance with the resistance of the equivalent resistance at the memory cell. For example, when the variable resistance element of a memory cell is in a low resistance state (LRS), the input current is determined by an intersection F between the IV characteristics 162 of the p-channel transistor 28b at the memory cell and the IV characteristics 167 of the equivalent resistance (LRS) of the memory cell input 21. When the variable resistance element of a memory cell is in a high resistance state (HRS), the input current is determined by an intersection C between IV characteristics 162 of the p-channel transistor 28b at the memory cell and IV characteristics 166 of equivalent resistance (HRS) of the memory cell input 21.

The intersection F indicates the operating point of the p-channel transistor 28a at the reference cell. The drain voltage at the intersection F is an output voltage DAT 171 in a low resistance state (LRS). The intersection C indicates the operating point of the p-channel transistor 28a at the reference cell. The drain voltage at the intersection C is an output voltage DAT 170 in a high resistance state (HRS). These voltages correspond to the gate voltage of the p-channel transistor 28a at the reference cell. The line indicating IV characteristics (LRS) 163 of the p-channel transistor 28a at the reference cell passes through the intersection F. The line indicating IV characteristics (HRS) 164 of the p-channel transistor 28a at the reference cell passes through the intersection C. These IV characteristics (LRS) 163 and (HRS) 164 are the characteristics of a current load circuit at the reference cell. An intersection E between the IV characteristics (LRS) 163 of the current load circuit and IV characteristics 165 of equivalent resistance of the reference input 22 indicates an output voltage REF 173 in a low resistance state (LRS). An intersection D between the IV characteristics (HRS) 164 of the current load circuit and the IV characteristics 165 indicates an output voltage REF 172 in a high resistance state (HRS).

The difference in the drain voltage between the intersection E and the intersection F is the amplitude of the output voltage where the variable resistance element is a low resistance state. The difference in the drain voltage between the intersection C and the intersection D is the amplitude of the output voltage where the variable resistance element is a high resistance state. If the input and the output of the current mirror pair are not inverted, that is, as compared to the configuration shown in FIG. 6, the current mirror pair 28 according to this embodiment operates with a great drain bias current when the variable resistance element is in the low resistance state, thereby increasing the output voltage. On the other hand, in the high resistance state, the output voltage decreases, since the bias current of the drain decreases.

As described above, the configuration of this embodiment is advantageous in accurately determining that the variable resistance element is in the low resistance state in verification reading when rewriting data to a memory cell. However, with the configuration of the this embodiment alone, the accuracy in reading at the high resistance may degrade, the configuration of the current mirror pair 28 may be replaced with the configurations shown in FIGS. 6 and 7. The configuration of this embodiment may be selectively used in verification operation etc., at the low resistance using an analog switch.

As described above, in this embodiment, the input and the output of the current mirror pair 28 are inverted in the configuration shown in FIG. 6, thereby improving the accuracy in reading data in the first amplification stage at low resistance.

Seventh Embodiment

Figure 9:
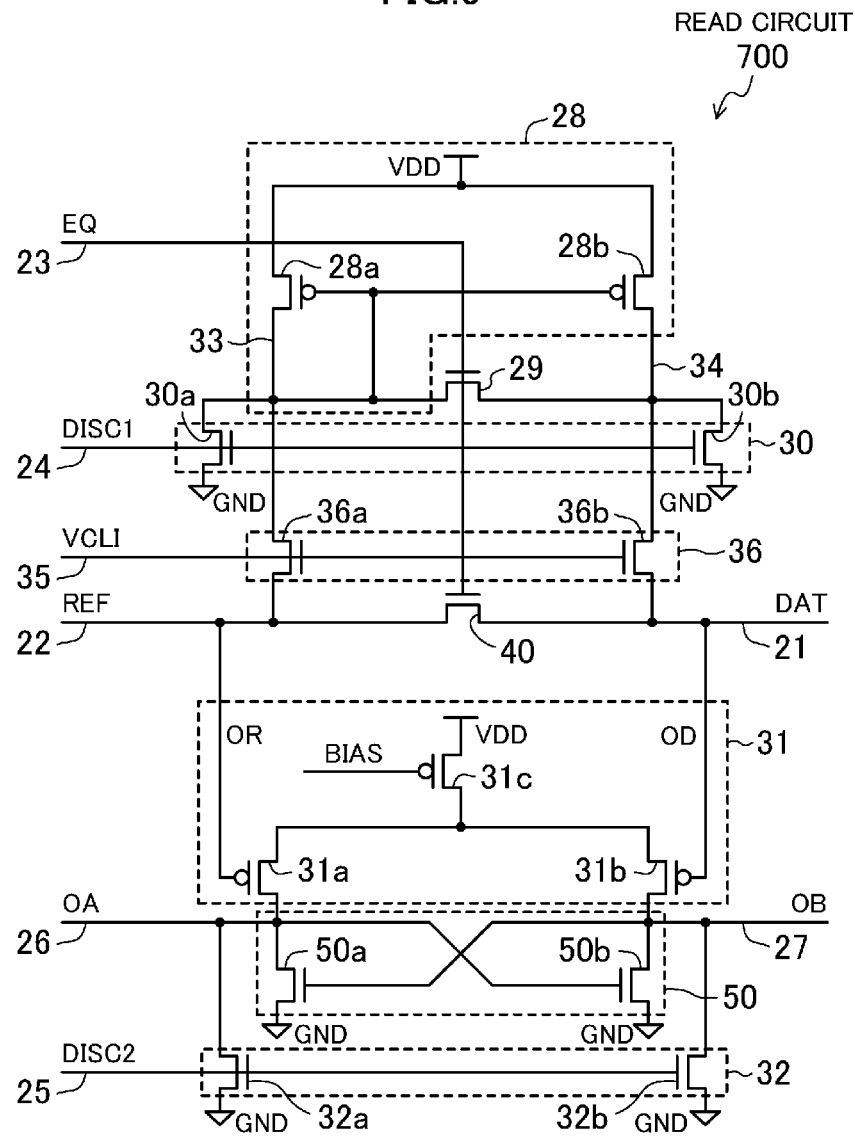
FIG. 9 is a circuit diagram of a read circuit according to a seventh embodiment.

As a seventh embodiment, a read circuit described below has the configuration of the fifth embodiment, but the output node of the first amplification stage has a low voltage. FIG. 9 is a circuit diagram of the read circuit according to the seventh embodiment, and the diagram of an equivalent circuit of the read circuit shown in the first embodiment. The timing of read operation according to this embodiment is similar to that of the first embodiment.

In a read circuit 700, the sources of the clamp transistor pair 36 are coupled to differential inputs OR and OD of the differential transistor pair 31. The gate of the p-channel transistor 31a is coupled to the drain of the second equalization transistor 40. The gate of the p-channel transistor 31b is coupled to the source of the second equalization transistor 40.

This embodiment assumes that a power source voltage VDD is sufficiently low, and the clamp transistor pair 36 in a non-saturated state. In this case, the potential of the sources of the clamp transistor pair 36 is not fixed, and is the potential generated by shifting the levels of the voltages of the drains to the ground level. The gate drive voltages of the p-channel transistors 31a and 31b forming the differential transistor pair 31 increase to increase the drain current, thereby operating the differential transistor pair 31 at a lower voltage. When operation at a lower voltage is not necessary, the operating speed increases.

As described above, in this embodiment, in operation at a low voltage, the speed of the differential transistor pair 31 in the second amplification stage increases, and the lower limit of the operating voltage of the differential transistor pair 31 can be lowered.

Eighth Embodiment

As an eighth embodiment, a read circuit described below has the configuration of the fifth embodiment, which has a first equalization transistor optimized to operate at a low voltage. FIG. 10A is a circuit diagram of the read circuit according to the eighth embodiment, and is the diagram of an equivalent circuit of the read circuit shown in the first embodiment. The timing of read operation according to this embodiment is similar to that of the first embodiment.

In a read circuit 800, the first equalization transistor 29 is a CMOS switch 29 shown in FIG. 10B, and the second equalization transistor 40 is an n-channel transistor. The equalization signal 23 (EQ) is supplied to the gate of the second equalization transistor 40 and a control terminal C of the CMOS switch 29. The CMOS switch 29 is formed by coupling a p-channel transistor 29a and an n-channel transistor 29b in parallel. The control terminal C is coupled to the gate of the n-channel transistor 29b, and is inverted by an inverter 29c to be coupled to the gate of the p-channel transistor 29a. Thus, when the control terminal C is at a high level, the both transistors 29a and 29b are controlled to be in a conduction state. The CMOS switch 29 described in the subsequent embodiments have a configuration similar to that of this embodiment.

When the equalization signal 23 is high, the CMOS switch 29 and the second equalization transistor 40, which are the equalization circuits, are both in the conduction state to start equalization operation. As example operating voltages, assume that the power source voltage of the read circuit 800 is low (e.g., Vdd=0.9 V), and the threshold voltages of the transistors are expressed by |Vtn|=|Vtp|=0.4V. Then the voltage level between the ends (a terminal A and a terminal B) of the CMOS switch 29 is 0.45 V, and the drain/source voltage Vds of the n-channel transistor 29b is about 0.3 V. Therefore, the CMOS switch 29 is suitable as the first equalization transistor 29 to allow the first equalization transistor 29 to perform accurate equalization. On the other hand, the n-channel transistor is effective as the second equalization transistor 40 to allow the second equalization transistor 40 to perform accurate equalization, since no p-channel transistor operates due to the threshold voltages.

As described above, in this embodiment, the equalization transistors are used independently in low voltage operation, thereby performing highly accurate equalization with high area efficiency.

Ninth Embodiment

Figure 11:
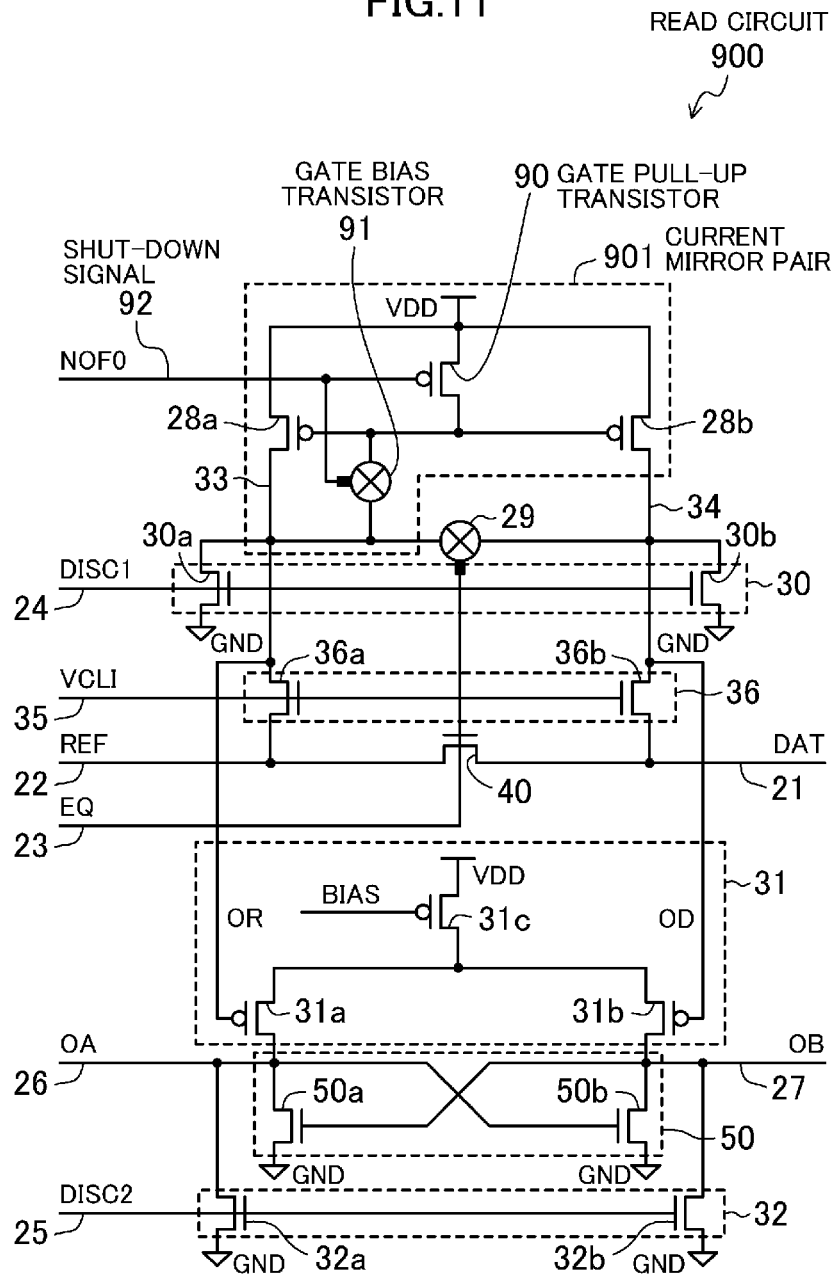
FIG. 11 is a circuit diagram of a read circuit according to a ninth embodiment.

As a ninth embodiment, a read circuit described below has the configuration of the eighth embodiment, but the current consumption of the current mirror pair is reduced. FIG. 11 is a circuit diagram of the read circuit according to the ninth embodiment including a current mirror pair with low current consumption, and is the diagram of an equivalent circuit of the read circuit shown in the first embodiment.

A read circuit 900 includes a current mirror pair 901 with low current consumption in place of the current mirror pair 28 in the configuration of the eighth embodiment. The current mirror pair 901 includes a gate pull-up transistor 90 and a gate bias transistor 91 in addition to the p-channel current mirror transistors 28a and 28b forming a conventional current mirror.

The gate pull-up transistor 90 is a p-channel transistor, and controls coupling between the gates of the p-channel transistors 28a and 28b of the current mirror pair 901 and the power source VDD.

The gate bias transistor 91 is a CMOS switch (see FIG. 10B). The CMOS switch is inserted to the path coupling the mirror current input drain 33 receiving the reference current, and the gate of the p-channel transistor 28a. The drain of the p-channel transistor 28a is coupled to the gate of the p-channel transistor 28a via the CMOS switch to form diode coupling. The CMOS switch and the gate of the gate pull-up transistor 90 are controlled complementarily with a shutdown signal 92.

Specifically, when the shutdown signal 92 is high, the gate bias transistor 91 is in a conduction state, and the gate pull-up transistor 90 is in a non-conduction state. This allows the current mirror pair 901 to supply current. When the shutdown signal 92 is low, the gate bias transistor 91 is in the non-conduction state, and the gate pull-up transistor 90 is in the conduction state. The current mirror pair 901 interrupts the current supply. When the first discharge transistor pair 30 is in the conduction state, the shutdown signal 92 is controlled to be low, thereby shutting excessive currents flowing to the ground via the first discharge transistor pair 30.

Next, specific operation of the read circuit according to this embodiment will be described with reference to FIG. 12. FIG. 12 is a waveform chart illustrating the operation of the read circuit according to this embodiment.

In FIG. 12, read operation starts at a read operation start time T0. The operation of the read circuit 900 starts at an operation start time T1. The read operation completes at a read operation end time T6.

Before the time T0, the shutdown signal 92 (NOF0) is low, and the first discharge signal 24 (DISC1) is high. The gates (OR and OD) of the differential transistor pair 31 are discharged to the ground level. The current mirror pair 901 is cut off not to cause unnecessary current consumption. The equalization signal 23 (EQ) is high, and the gates (OR and OD) of the differential transistor pair 31 are short-circuited. Furthermore, the second discharge signal 25 (DISC2) is high, and the drains (OA and OB) of the differential transistor pair 31 are discharged to the ground level.

At the time T0, the logic level of a cell selection signal 130 (WL/CS) is transited, thereby starting the read operation. The cell selection signal 130 (WL/CS) includes a column selection signal and a row selection signal for selecting a memory cell from the non-volatile memory array, and other control signals.

Until the time T1, the selection of the memory cell ends. At the time T1, the shutdown signal 92 (NOF0) is high, and the first discharge signal 24 (DISC 1) is low, and the current mirror pair 901 is turned on. The potential of the gates (OR and OD) of the differential transistor pair 31 increases, while being kept at the same value. As such, the potential is kept at the same potential, thereby charging the floating capacitance of the column gates and the bit lines coupled to the reference input 22 and the memory cell input 21 to the same potential. This reduces voltage mismatch caused by the mismatch of the capacitance of the reference input 22 and the memory cell input 21.

After an equalization period 140 has passed from the time T1, the equalization signal 23 (EQ) is transited to the low level to release the equalized state. At the release of the equalized state, a voltage difference VODIF occurs between OR and OD, which are the gate potential of the differential transistor pair 31.

At a time T3, after a first integration period 138 has passed from a time T2 when the equalized state was released, the second discharge signal 25 (DISC2) is transited to the low level to release the discharged states of the drains (OA and OB) of the differential transistor pair 31, and to start charging the drains of the differential transistor pair 31. This increases the potential of OA and OB to the respective levels. By setting VODIF at this time to a value greater than the offset voltage of the differential transistor pair 31, malfunction can be reduced.

If one of the potential of the drains (OA and OB) of the differential transistor pair 31 exceeds the threshold voltage Vtn of the cross-coupled transistor pair 50, the potential of the other one is pulled down to the ground.

Between a time T4, after a second integration period 139 has passed from the time T3, when the discharged states of the drains (OA and OB) of the differential transistor pair 31 are released, and the subsequent time T5, the potential of the drains (OA and OB) of the differential transistor pair 31 are taken in a sampling circuit (not shown in FIG. 11) by a sampling signal 136 (CAP), and held as data output 137 (DATA). The second integration period 139 is set to the time required so that the potential of one of the drains (OA and OB) of the differential transistor pair 31 exceeds the threshold voltage Vtn of the cross-coupled transistor pair 50, and the potential of the other one is pulled down to the ground.

As described above, in this embodiment, the shutdown signal 92 is controlled with the timing of the discharge signals 24 and 25, thereby enabling low current consumption. In addition, the equalization operation reduces malfunction caused by capacitance mismatch, thereby increasing the read accuracy. Furthermore, the first integration period 138 is provided to reduce malfunction caused by input offsets in the second amplification stage, thereby increasing the read accuracy. Since influence of the capacitance mismatch or input offsets increases at a low voltage, this embodiment is useful for read circuits performing low voltage operation.

In this embodiment, at the read operation end time T6, the shutdown signal 92, the first discharge signal 24, and the equalization signal 23 are transited to the initial states at the same time. These signals may be transited immediately after the determination of the data output 137. This reduces the current consumption of the current mirror pair 28.

Tenth Embodiment

As a tenth embodiment, a read circuit described below has the configuration of the ninth embodiment, but the current mirror pair has variable current drive capability. FIG. 13 is a circuit diagram of the read circuit according to the tenth embodiment including a current mirror pair with variable current drive capability, and is the diagram of an equivalent circuit of the read circuit shown in the first embodiment.

A read circuit 1500 includes a current mirror pair 1501 with variable current drive capability in place of the current mirror pair 901 of the ninth embodiment. Read operation of this embodiment is similar to that of the ninth embodiment.

The current mirror pair 1501 includes two p-channel transistor pairs L and S, two gate pull-up transistors 90a and 90b, and two CMOS switches 91a and 91b as gate bias transistors. The current mirror pair 1501 receives two shutdown signals S100 (NOF2) and L101 (NOF1).

The p-channel transistor pair L includes p-channel transistors 28a and 28b. The p-channel transistor pair S includes p-channel transistors 28c and 28d. The sizes of the p-channel transistors 28a and 28b are different from the sizes of the p-channel transistors 28c and 28d. The p-channel transistors 28a and 28c are coupled in parallel to the mirror current input drain 33, and the p-channel transistors 28b and 28d are coupled in parallel to the mirror current output drain 34.

The gate pull-up transistor 90a includes a p-channel transistor, which is coupled between the power source VDD and the drains of the p-channel transistor pair S. The gate of the gate pull-up transistor 90a receives the shutdown signal 5100.

The gate pull-up transistor 90b includes a p-channel transistor, which is coupled between the power source VDD and the drains of the p-channel transistor pair L. The gate of the gate pull-up transistor 90b receives the shutdown signal L101.

The CMOS switch 91a receives the shutdown signal S100, and is coupled between the gates of the p-channel transistor pair S and the mirror current input drain 33. The CMOS switch 91a and the gate pull-up transistor 90a are arranged in a pair.

The CMOS switch 91b receives the shutdown signal L101, and is coupled between the gates of the p-channel transistor pair L and the mirror current input drain 33. The CMOS switch 91b and the gate pull-up transistor 90b are arranged in a pair.

The operation of the current mirror pair 1501 will be described. When the first discharge transistor pair 30 is in the conduction state, that is, when the n-channel transistors 30a and 30b are in the conduction state, the shutdown signal S100 and the shutdown signal L101 are controlled to be low. This shuts excessive currents flowing to the ground via the first discharge transistor pair 30. On the other hand, when the first discharge transistor pair 30 is in the non-conduction state, that is, when the n-channel transistors 30a and 30b are in the non-conduction state, at least one of the shutdown signals is controlled to be high, thereby activating the current mirror pair 1501.

In the current mirror pair 1501, the p-channel transistor pair S is controlled with the shutdown signal 5100, and the p-channel transistor pair L is controlled with the shutdown signal L101. The drive current of the current mirror formed by the p-channel transistors 28a and 28b of the p-channel transistor pair L is greater than that of the p-channel transistors 28c and 28d of the p-channel transistor pair S.

When the read circuit 1500 operates at a low voltage, only the shutdown signal L101, or both of the shutdown signal S100 and the shutdown signal L101 are turned high, thereby performing the read operation with the current mirror pair 1501 having the maximum current drive capability. When the read circuit 1500 operates at a high voltage, only the shutdown signal S100 is turned high, thereby performing the read operation with the current mirror pair 1501 having the minimum current drive capability.

The current drive capability of the current mirror pair 1501 is variable in accordance with the power source voltage in order to increase the reading speed when the current mirror pair 1501 operates at a high voltage. Usually, the operating speed of high voltage operation is expected to be higher than the operating speed of low voltage operation. However, in this embodiment, when the low voltage operation is optimized, the p-channel transistor pairs L and S in the current mirror pair 1501 are formed in significantly large sizes to obtain large drain currents. The current mirror using large transistors has great parasitic capacitance to hinder high voltage operation at high speed. In high voltage operation, the current drive capability is excessive, thereby generating great overshoot at nodes coupled to OR and OD. This requires a settling time (i.e., a relaxation time) to hinder high speed operation.

Figure 14A:
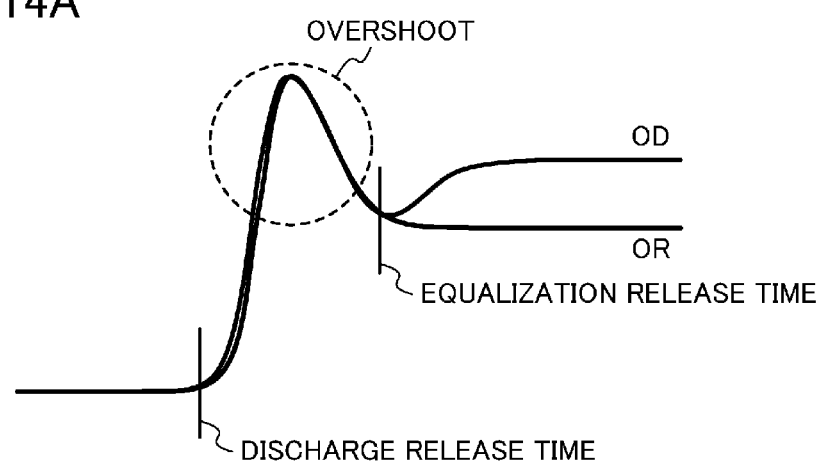
FIGS. 14A-14B are waveform charts illustrating operation of the read circuit according to the tenth embodiment.

This point will be described with reference to FIG. 14. FIG. 14 is a waveform chart illustrating the operation of the read circuit according to this embodiment. FIG. 14A illustrates changes of the outputs OD and OR at the first stage, when high voltage operation is performed with a current mirror using transistors in the sizes optimized for low voltage operation. Immediately after charging (i.e., immediately after the release time of discharge), the clamp transistor pair 36 shuts the bit line capacitance to cause overshoot of OD and OR, and the equalization release time is set after the settling of the overshoot. Therefore, the access time increases by the settling time of the overshoot.

Figure 14B:
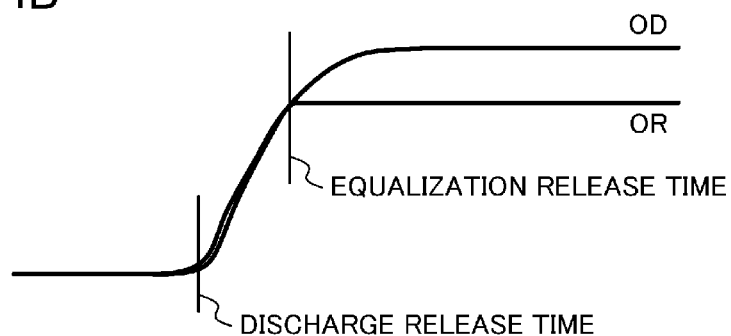

FIG. 14B illustrates high voltage operation similar to that in FIG. 14A, and changes in OR and OD occurring when using transistors in small sizes suitable for high voltage operation. This causes no overshoot of the outputs OD and OR at the first stage, equalization is released at a desired level, thereby enabling high speed operation. Therefore, in order to perform high voltage operation at high speed in a circuit optimized to low voltage operation, the current drive capability of a current mirror in high voltage operation may be reduced as in this embodiment.

As described above, in this embodiment, the sizes of the transistors used for the current mirror are variable in accordance with the power source voltage, thereby operating the current mirror at a wide voltage range at high speed. In particular, this embodiment is useful for low voltage operation. In this embodiment, the current mirror is formed by using the transistors in two sizes. It is clear that similar advantages are provided even if the current mirror includes transistors in more sizes.

Eleventh Embodiment

Figure 15:
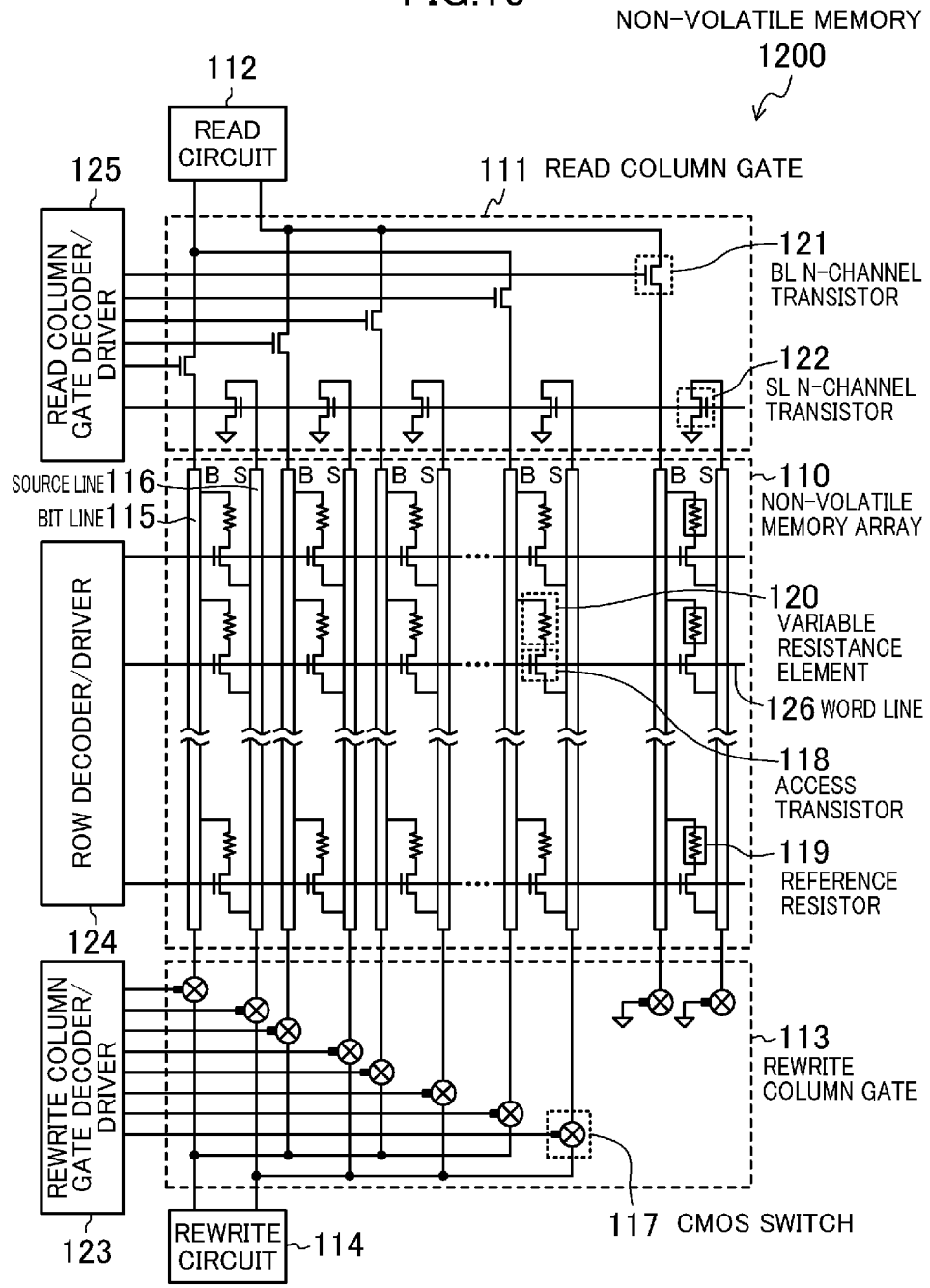
FIG. 15 is a block diagram of a non-volatile memory according to an eleventh embodiment.

A non-volatile memory according to an eleventh embodiment will be described. FIG. 15 is a block diagram of the non-volatile memory according to the eleventh embodiment. In FIG. 15, a non-volatile memory 1200 includes as principal components, a non-volatile memory array 110, a read column gate 111, the read circuit 112 according to any one of the above-described embodiments, a rewrite column gate 113, a rewrite circuit 114, a read column gate decoder/driver 125, a row decoder/driver 124, and a rewrite column gate decoder/driver 123.

The non-volatile memory array 110 is, for example, an array of 1T1R-type memory cells. Each 1T1R-type memory cell includes a non-volatile variable resistance element 120 such as a ReRAM and an access transistor 118. This embodiment assume that the variable resistance element 120 is an element requiring bidirectional voltage/current application for rewiring data of the memory cell.

In the non-volatile memory array 110, the terminals of the variable resistance elements of the memory cells are coupled to bit lines 115 (B) extending in parallel. The terminals of the sources of the access transistors 118 are coupled to source lines 116 (S) extending in parallel. Word lines 126 are arranged in orthogonal to the bit lines B and the source lines S. The gates of the access transistor 118 arranged in parallel to the word lines 126 are coupled to the word lines 126. A desired memory cell is accessed by selecting one of the word lines, and one pair of the bit lines B and the source lines S.

The rewrite circuit 114 selects a desired pair of the bit lines B and the source lines S via a dedicated rewrite column gate 113. A selection signal for selecting the pair of the bit lines B and the source lines S is generated by the rewrite column gate decoder/driver 123. In rewrite operation, the read column gate 111 is controlled to be non-selective. In rewrite operation, voltages are applied bidirectionally to the bit lines B and the source lines S. Thus, the rewrite column gate 113 includes CMOS switches 117. Rewrite operation requires more current than read operation, and thus, the sizes of the CMOS switches are larger than the sizes of BL n-channel transistors 121 for reading.

The read circuit 112 selects one of the bit lines B and one of the source lines S via the dedicated read column gate 111. The signal for selecting the bit line B and the source line S is generated by the read column gate decoder/driver 125. In read operation, the rewrite column gate 113 is controlled to be non-selective. The read column gate 111 includes the plurality of BL n-channel transistors 121 coupled to the bit lines B, and a plurality of SL n-channel transistors 122 coupled to the source lines S. Since the SL n-channel transistor 122 may set all of the source lines S to the ground level in read operation, there is no need to select the respective source lines S independently.

In order to form a usual column gate using a column gate for reading and rewriting in common, the read column gate 111 may be omitted, and the read circuit 112 may be coupled in parallel to the rewrite circuit 114. In this case, the inputs of the read circuit 112 are coupled to numbers of CMOS switches 117 of the rewrite column gate 113, thereby causing larger parasitic capacitance. This parasitic capacitance hinders read operation at high speed with low power consumption. The number of coupling can be reduced by coupling the CMOS switches 117 hierarchically. However, this causes multi-stage coupling, which is not preferable in view of voltage drop.

By contrast, as in this embodiment, if the column gates are divided into two for read operation and rewrite operation, one drain of a CMOS switch appears as a parasitic capacitor in read operation, thereby largely reducing the parasitic capacitance. That is, this embodiment has the configuration preferred to read operation at high speed with low current consumption. In particular, this embodiment is useful for low voltage operation, since the parasitic capacitance is great at the pn junctions of the drains.

Twelfth Embodiment

Figure 16:
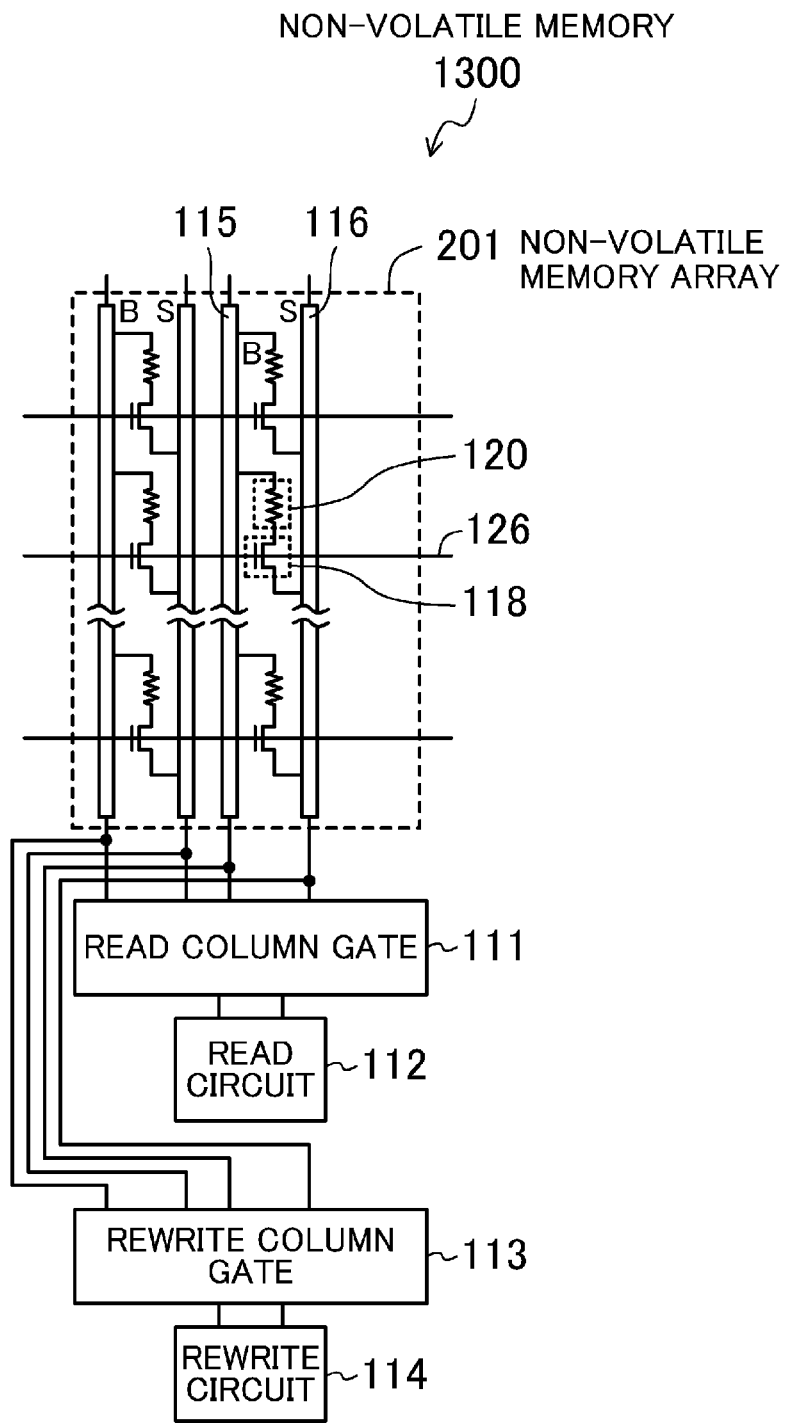
FIG. 16 is a block diagram of a non-volatile memory according to a twelfth embodiment.

A non-volatile memory according to a twelfth embodiment will be described. FIG. 16 is a block diagram of the non-volatile memory according to the twelfth embodiment. FIG. 16 illustrates arrangement of circuit blocks. In a non-volatile memory 1300, a read column gate 111, a read circuit 112, a rewrite column gate 113, and a rewrite circuit 114 are arranged collectively at one ends of bit lines 115 and source lines 116 of a non-volatile memory array 201.

The non-volatile memory according to this embodiment has the features of the eleventh embodiment. In addition, since the control circuits of the read column gate 111 and the rewrite column gate 113 are arranged collectively at one end of the non-volatile memory array 201, the circuit area decreases when wire layers are provided with high flexibility. In layout designing as well, the size of the non-volatile memory array is easily changed.

Thirteenth Embodiment

Figure 17:
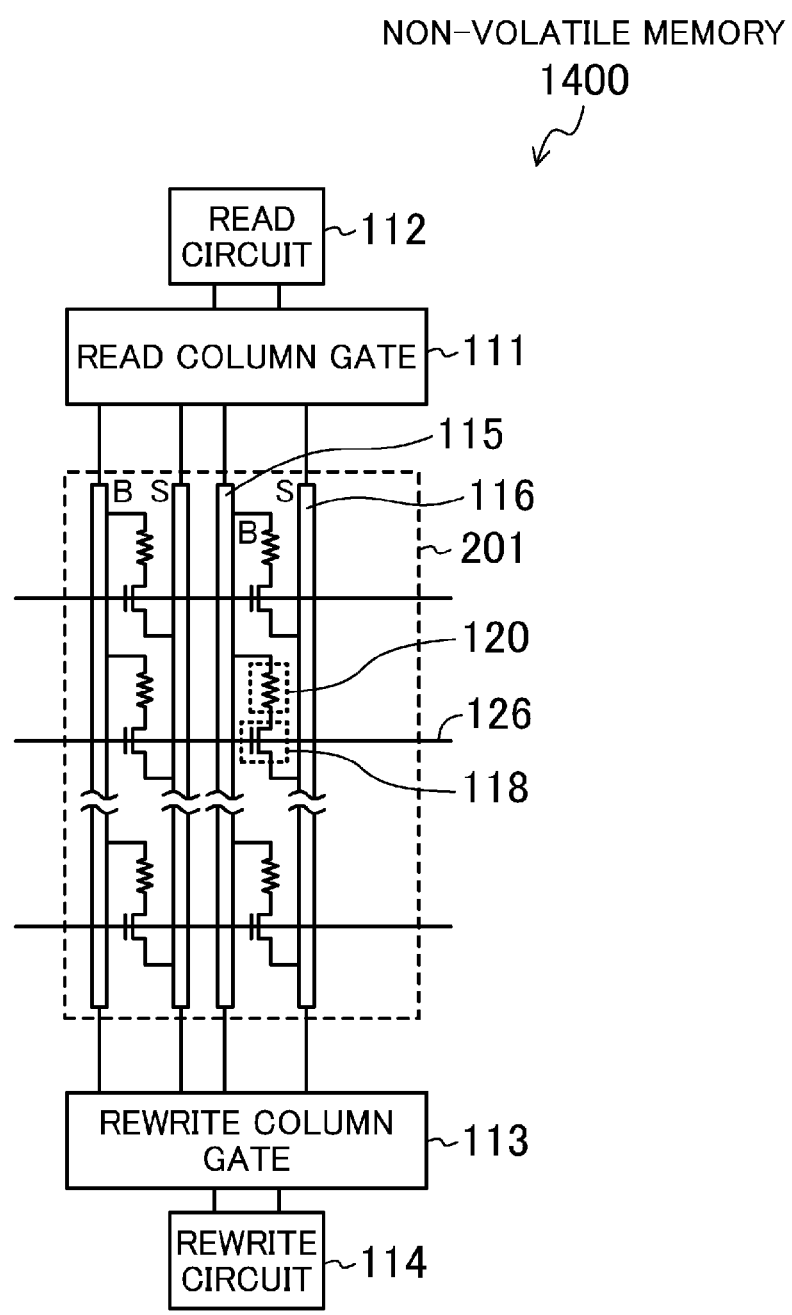
FIG. 17 is a block diagram of a non-volatile memory according to a thirteenth embodiment.

A non-volatile memory according to a thirteenth embodiment will be described. FIG. 17 is a block diagram of the non-volatile memory according to the thirteenth embodiment. FIG. 17 illustrates arrangement of circuit blocks. In a non-volatile memory 1400, a read column gate 111 and a read circuit 112 are arranged collectively at one ends of bit lines 115 and source lines 116 of a non-volatile memory array 201. On the other hand, a rewrite column gate 113 and a rewrite circuit 114 are arranged collectively at the other ends of the bit lines 115 and the source lines 116.

The non-volatile memory according to this embodiment has the features of the eleventh embodiment. In addition, the circuits for reading and rewriting are arranged separately with the non-volatile memory array 201 interposed therebetween. This reduces wiring congestion even if a small number of wiring layers are provided, thereby facilitating layout designing.

What is claimed is:

1. A read circuit reading data from a non-volatile memory array including a variable resistance memory cell, the read circuit comprising:
   a current load circuit configured to supply a load current from a power source to a first input and a second input, which are coupled to the non-volatile memory array;
   a first discharge circuit configured to discharge potential of the first and second inputs to a ground level by control with a first discharge signal;
   an equalization circuit configured to short-circuit the first and second inputs by control with equalization signal to equalize the potential of the first and second inputs;
   a differential circuit configured to receive the first and second inputs as differential inputs, and to output a first read output and a second read output as differential outputs; and
   a second discharge circuit configured to discharge potential of the first and second read outputs to the ground level by control with a second discharge signal.

2. The read circuit of claim 1, wherein
   before the read circuit performs read operation,
      the first discharge circuit fixes the first and second inputs to the ground level in accordance with the first discharge signal,
      the equalization circuit short-circuits the first and second inputs in accordance with the equalization signal, and
      the second discharge circuit fixes the first and second read outputs to the ground level in accordance with the second discharge signal, and
   when the read circuit performs the read operation,
      the first discharge circuit releases fixation of the first and second inputs to the ground level in accordance with the first discharge signal,
      after release by the first discharge circuit, the equalization circuit releases short-circuit of the first and second inputs in accordance with the equalization signal, and
      after release by the equalization circuit, the second discharge circuit releases fixation of the first and second read outputs to the ground level in accordance with the second discharge signal.

3. A non-volatile memory comprising:
   the read circuit of claim 1;
   a non-volatile memory array including the variable resistance memory cell;
   a read column gate configured to select a bit line or a source line to select the variable resistance memory cell from the non-volatile memory array when the read circuit performs read operation of the variable resistance memory cell included in the non-volatile memory array;
   a rewrite circuit configured to perform rewrite operation of the variable resistance memory cell included in the non-volatile memory array; and
   a rewrite column gate configured to select the bit line or the source line to select the variable resistance memory cell from the non-volatile memory array when the rewrite circuit performs the rewrite operation of the variable resistance memory cell included in the non-volatile memory array.

4. The non-volatile memory of claim 3, wherein
   the read column gate is a switch of an n-channel transistor, and
   the rewrite column gate is a CMOS switch formed by coupling a p-channel transistor and an n-channel transistor in parallel.

5. The non-volatile memory of claim 3, wherein
   the read circuit, the read column gate coupled to the read circuit, the rewrite circuit, and the rewrite column gate coupled to the rewrite circuit are located at one ends of the bit line and the source line.

6. The non-volatile memory of claim 3, wherein
   the read circuit and the read column gate coupled to the read circuit are located at one ends of the bit line and the source line, and
   the rewrite circuit and the rewrite column gate coupled to the rewrite circuit are located at the other ends of the bit line and the source line.

7. A read circuit reading data of a variable resistance memory cell in comparison with a reference cell, the read circuit comprising:
- a memory cell input coupled to the variable resistance memory cell;
- a reference input coupled to the reference cell;
- a current mirror pair being a pair of p-channel transistors, each having a source coupled to a power source, one of the p-channel transistors having a drain coupled to gates of the pair of p-channel transistors being a mirror current input drain coupled to the reference input, and the other of the p-channel transistors having a drain being a mirror current output drain coupled to the memory cell input;
- a first equalization transistor having a gate receiving an equalization signal, and a drain and a source, which are coupled between the drains of the pair of p-channel transistors of the current mirror pair;
- a first discharge transistor pair being a pair of n-channel transistors, each having a gate receiving a first discharge signal, and a source coupled to ground, one of the n-channel transistors having a drain coupled to the drain of the first equalization transistor, and the other of the n-channel transistors having a drain coupled to the source of the first equalization transistor;
- a differential transistor pair being a pair of p-channel transistors, each having a source coupled to the power source, and a drain outputting a first read output or a second read output, which is a differential output, one of the p-channel transistors having a gate coupled to the drain of the first equalization transistor, and the other of the p-channel transistors having a gate coupled to the source of the first equalization transistor; and
- a second discharge transistor pair being a pair of n-channel transistors, each having a gate receiving a second discharge signal, and a drain coupled to one of the drains of the p-channel transistors of the differential transistor pair, and a source coupled to the ground.

8. The read circuit of claim 7, further comprising:
a clamp transistor pair being a pair of n-channel transistors, each having a gate receiving a clamp voltage input as an input signal, wherein
the mirror current input drain is coupled to the reference input via a drain and a source of one of the n-channel transistors of the clamp transistor pair, and
the mirror current output drain is coupled to the memory cell input via a drain and a source of the other of the n-channel transistors of the clamp transistor pair.

9. The read circuit of claim 8, wherein
a voltage is applied to the clamp voltage input such that output voltages of the memory cell input and the reference input are equal to or lower than 500 mV.

10. The read circuit of claim 8, further comprising:
a second equalization transistor including an n-channel transistor having a gate receiving an equalization signal, and a drain and a source, which are coupled between the reference input and the memory cell input.

11. The read circuit of claim 10, wherein
the gate of the one of the p-channel transistors of the differential transistor pair is coupled not to the drain of the first equalization transistor but to the drain of the second equalization transistor, and
the gate of the other of the p-channel transistors is coupled not to the source of the first equalization transistor but to the source of the second equalization transistor.

12. The read circuit of claim 7, wherein
the first equalization transistor is a CMOS switch formed by coupling a p-channel transistor and an n-channel transistor in parallel.

13. The read circuit of claim 7, further comprising:
a cross-coupled transistor pair including a first n-channel transistor and a second n-channel transistor, each having a drain coupled to the first read output or the second read output, and a source coupled to the ground, the first n-channel transistor having a gate coupled to the drain of the second n-channel transistor, and the second n-channel transistor having a gate coupled to the drain of the first n-channel transistor.

14. The read circuit of claim 7, wherein
the mirror current input drain is coupled not to the reference input but to the memory cell input, and
the mirror current output drain is coupled not to the memory cell input but to the reference input.

15. The read circuit of claim 7, further comprising:
a pull-up transistor including a p-channel transistor having a gate receiving a shutdown signal, and a drain and a source, which are coupled between the gates of the p-channel transistors of the current mirror pair and the power source; and
a gate bias transistor including a CMOS switch coupled between the gates of the p-channel transistors of the current mirror pair and the mirror current input drain, formed by coupling a p-channel transistor and an n-channel transistor in parallel, and receiving the shutdown signal, wherein
when any one of the p-channel transistor of the pull-up transistor or the CMOS switch of the gate bias transistor is in a conduction state, the shutdown signal complementarily brings the other to a non-conduction state,
when the n-channel transistors of the first discharge transistor pair are in the conduction state, the shutdown signal brings the p-channel transistor of the pull-up transistor to the conduction state, and the CMOS switch of the gate bias transistor to the non-conduction state to inactivate the current mirror pair, and
when the n-channel transistors of the first discharge transistor pair are in the non-conduction state, the shutdown signal brings the p-channel transistor of the pull-up transistor to the non-conduction state, and the CMOS switch of the gate bias transistor to the conduction state to activate the current mirror pair.

16. The read circuit of claim 7, comprising:
the current mirror pair configured to receive a plurality of shutdown signals;
the current mirror pair including a plurality of p-channel transistor pairs;
a plurality of pull-up transistors each corresponding to one of the plurality of p-channel transistor pairs, and having a gate receiving one of the plurality of shutdown signals, and a drain and a source, which are coupled between gates of the corresponding one of the p-channel transistor pairs and the power source; and
a plurality of gate bias transistors each including a CMOS switch corresponding to one of the plurality of p-channel transistor pairs, being paired with one of the plurality of pull-up transistors, coupled between gates of the corresponding one of the p-channel transistor pairs and the mirror current input drain, being formed by coupling a p-channel transistor and an n-channel transistor in parallel, and receiving one of the shutdown signals corresponding to the paired one of the plurality of pull-up transistors, wherein when the n-channel transistors of the first discharge transistor pair are in a conduction state, each of the plurality of shutdown signals brings the p-channel transistor of corresponding one of the plurality of pull-up transistors to the conduction state, and the CMOS switch of corresponding one of the plurality of gate bias transistors to a non-conduction state to inactivate the current mirror pair, and when the n-channel transistors of the first discharge transistor pair are in the non-conduction state, at least one of the plurality of shutdown signals brings the p-channel transistor of corresponding one of the plurality of pull-up transistors to the non-conduction state, and the CMOS switch of paired one of the plurality of gate bias transistors to the conduction state to activate the current mirror pair.

17. The read circuit of claim 7, wherein
before the read circuit performs read operation,
the first discharge transistor pair fixes the mirror current input drain and the mirror current output drain to a ground level in accordance with the first discharge signal,
the first equalization transistor short-circuits the mirror current input drain and the mirror current output drain in accordance with the equalization signal, and
the second discharge transistor pair fixes potential of the drains of the p-channel transistors of the differential transistor pair to the ground level in accordance with the second discharge signal,
when the read circuit operates the read operation,
the first discharge transistor pair releases fixation of the mirror current input drain and the mirror current output drain to the ground level by transition of the first discharge signal,
the first equalization transistor releases short-circuit of the mirror current input drain and the mirror current output drain by transition of the equalization signal after a desired equalization period has passed after release by the first discharge transistor pair, and
the second discharge transistor pair releases fixation of the drains of the p-channel transistors of the differential transistor pair to the ground level by transition of the second discharge signal after a desired first integration period has passed after release by the first equalization transistor, and
the read circuit determines an output logic level based on levels of the drains of the p-channel transistors of the differential transistor pair after a desired second integration period has passed after release by the second discharge transistor pair.

18. A non-volatile memory comprising:
the read circuit of claim 7;
a non-volatile memory array including the variable resistance memory cell;
a read column gate configured to select a bit line or a source line to select the variable resistance memory cell from the non-volatile memory array when the read circuit performs read operation of the variable resistance memory cell included in the non-volatile memory array;
a rewrite circuit configured to perform rewrite operation of the variable resistance memory cell included in the non-volatile memory array; and
a rewrite column gate configured to select the bit line or the source line to select the variable resistance memory cell from the non-volatile memory array when the rewrite circuit performs the rewrite operation of the variable resistance memory cell included in the non-volatile memory array.

19. The non-volatile memory of claim 18, wherein
the read column gate is a switch of an n-channel transistor, and
the rewrite column gate is a CMOS switch formed by coupling a p-channel transistor and an n-channel transistor in parallel.

20. The non-volatile memory of claim 18, wherein
the read circuit, the read column gate coupled to the read circuit, the rewrite circuit, and the rewrite column gate coupled to the rewrite circuit are located at one ends of the bit line and the source line.

21. The non-volatile memory of claim 18, wherein
the read circuit and the read column gate coupled to the read circuit are located at one ends of the bit line and the source line, and
the rewrite circuit and the rewrite column gate coupled to the rewrite circuit are located at the other ends of the bit line and the source line.

\* \* \* \* \*